US012621965B2

(12) United States Patent
Klein et al.

(10) Patent No.:    US 12,621,965 B2
(45) Date of Patent:         May 5, 2026

(54) HIGH-EFFICIENCY COOLING SYSTEMS AND METHODS FOR A COMPUTER DATA CENTER USING REFRIGERANT RECIRCULATION

(71) Applicants:Bradley John Klein, Chonburi (TH); Nicholas Ben Barrowclough, Porac (PH)

(72) Inventors: Bradley John Klein, Chonburi (TH); Nicholas Ben Barrowclough, Porac (PH)

(*) Notice: Subject to any disclaimer, the term of this patent is extended or adjusted under 35 U.S.C. 154(b) by 163 days.

(21) Appl. No.: 18/760,352

(22) Filed: Jul. 1, 2024

(65)          Prior Publication Data

US 2025/0393174 A1      Dec. 25, 2025

Related U.S. Application Data

(62) Division of application No. 18/749,543, filed on Jun. 20, 2024.

(51) Int. Cl.
    *H05K 7/20*          (2006.01)
(52) U.S. Cl.
    CPC ..... *H05K 7/20836* (2013.01); *H05K 7/20763* (2013.01); *H05K 7/208* (2013.01)
(58) Field of Classification Search
    CPC .............. F25C 2700/12; F25C 2600/04; F25C 2400/14; F25C 2400/10; F25C 2400/06; F25C 1/18; F25C 1/24; F25C 1/25; F25C 5/05; F28D 29/00; F25B 41/40; F25B 41/20; F25B 2600/2501; F25B 25/005; F25B 2400/23; H05K 7/20327; H05K 7/20836; H05K 7/208; H05K 7/20272; H05K 7/2059; H05K 7/20354
    See application file for complete search history.

(56)              References Cited

U.S. PATENT DOCUMENTS

| | | | | |
|---|---|---|---|---|
| 10,225,952 B2 * | 3/2019 | Chainer | .................... | G06F 1/20 |
| 10,283,793 B2 | 5/2019 | Yun | | |
| 2023/0247795 A1 * | 8/2023 | Khalili | .............. | H05K 7/20327 |
| | | | | 165/80.4 |

FOREIGN PATENT DOCUMENTS

| | | | | |
|---|---|---|---|---|
| CN | 108834366 A | * | 11/2018 | .......... H05K 7/2079 |
| CN | 114980678 A | * | 8/2022 | ......... H05K 7/20272 |
| CN | 218851184 U | | 4/2023 | |
| JP | 2011-220616 A | | 11/2011 | |
| KR | 10-2019-0046107 A | | 5/2019 | |
| KR | 10-2473595 | | 12/2022 | |

OTHER PUBLICATIONS

Machine English language translation of CN108834366 to Cai. Translated Feb. 2026 (Year: 2018).*
Machine English language translation of CN114980678 to Zhang. Translated Feb. 2026 (Year: 2022).*

* cited by examiner

*Primary Examiner* — Cassey D Bauer
(74) *Attorney, Agent, or Firm* — Boris Leschinsky

(57)            ABSTRACT

To facilitate the use of high-efficiency heat exchangers in a computer data center, a refrigerant recirculation line is provided to direct at least some refrigerant from the first refrigerant outlet of the first heat exchanger through an in-line refrigerant pump to mix with the refrigerant from the refrigerant supply and then flow to the first refrigerant inlet of the first heat exchanger. At least partial recirculation of refrigerant facilitates the use of warmer inlet refrigerant while still providing sufficient heat extraction.

13 Claims, 15 Drawing Sheets

Outside the Facility   Inside the Facility

HIGH-EFFICIENCY COOLING SYSTEMS AND METHODS FOR A COMPUTER DATA CENTER USING REFRIGERANT RECIRCULATION

CROSS-REFERENCE DATA

This patent application is a divisional application from a co-pending U.S. patent application Ser. No. 18/749,543 filed on Jun. 20, 2024, and entitled "HIGH-EFFICIENCY COOLING SYSTEMS AND METHODS FOR A COMPUTER DATA CENTER", which is incorporated herein by reference in its entirety.

BACKGROUND

Without limiting the scope of the invention, its background is described in connection with data center cooling systems. More particularly, the invention describes a high-efficiency cooling system using bypass lines to maximize heat extraction of the heat exchangers used therein.

The problem of heat generation in large, enclosed data centers, which arises from operating multiple computers simultaneously, is a critical issue that affects the efficiency, longevity, and operational costs of these facilities. Data centers, crucial hubs for storing, processing, and disseminating vast amounts of digital information, house numerous servers and other computing hardware that inherently produce significant amounts of heat during operation. This heat generation is primarily due to the electrical power consumed by the servers, which, when converted into energy to run computational tasks, also releases heat as a byproduct. As more servers are packed into a data center to handle increasing data demands, the cumulative heat produced can escalate rapidly.

This concentrated heat generation can lead to elevated temperatures within the data center, which, if not properly managed, can surpass the optimal operating conditions recommended for electronic hardware. High temperatures can degrade the performance of servers, increase the likelihood of hardware failures, and shorten the lifespan of the equipment. Furthermore, the need to cool these environments to maintain safe operating temperatures leads to significant energy consumption through cooling systems like air conditioners and chillers, which in turn increases operational costs and can have a detrimental environmental impact due to increased carbon emissions.

Managing this heat effectively is therefore not only critical for maintaining system reliability and performance but also for achieving energy efficiency and reducing the environmental footprint of data centers. The implementation of advanced cooling techniques, strategic data center layout design, and the adoption of energy-efficient technologies are among the approaches employed to tackle the heat management challenges in modern data centers.

Conventional air conditioning is one of the primary methods used to cool large data centers, alongside a variety of innovative cooling approaches designed to enhance efficiency and sustainability. The conventional method typically involves the use of Computer Room Air Conditioning (CRAC) units or Computer Room Air Handlers (CRAH) units. These systems regulate the temperature and humidity in the data center by circulating chilled air. Air is drawn in, cooled by refrigerants or chilled water in heat exchangers, and then distributed throughout the data center to absorb heat emitted by servers and other equipment. This warm air is then cycled back to the CRAC or CRAH units to be re-cooled and recirculated.

In addition to conventional air conditioning, alternative, and supplementary cooling strategies are also employed to manage heat in data centers more effectively. One such approach is the use of in-row cooling, where cooling units are placed directly between server racks. This setup minimizes the distance cold air must travel before reaching the servers, improving cooling efficiency and reducing the mixing of hot and cold air streams.

Another innovative method is hot aisle/cold aisle configuration, which organizes computer racks in alternating rows with their backs facing each other, creating hot aisles and cold aisles. Warm air goes up to the ceiling plenum and from there is recirculated by an air pump through the built-in chiller of the air conditioning system to enter a sub-floor space, before entering cold aisles. This configuration helps to manage airflow more predictably by confining and extracting the warm air emitted from the servers more efficiently.

For more sustainable options, some data centers utilize free cooling systems, which leverage external environmental conditions to aid in cooling. When the outside temperature is sufficiently low, outside air can be brought in to cool the facility, significantly reducing the reliance on mechanical cooling and thereby lowering energy consumption. Advanced versions of this technique include the use of economizers, which can switch between outside air and refrigeration-based cooling depending on the external weather conditions. Additionally, liquid cooling is a rapidly emerging technique that involves using water or other liquids in direct contact with components to absorb heat more effectively than air, which is particularly useful in high-density configurations where traditional air cooling is insufficient. These diverse cooling methodologies illustrate the dynamic and evolving nature of data center thermal management, reflecting ongoing efforts to maintain operational efficiency while minimizing environmental impact. They also highlight an unmet need for a more efficient system that requires minimal operational cost while reducing energy consumption for the data center cooling systems.

Modern cooling systems for data centers, while effective in managing the substantial heat generated by servers and other computing equipment, come with several disadvantages:

High Energy Consumption: Traditional cooling systems, particularly those reliant on air conditioning, consume a significant amount of energy. This is not only costly but also environmentally impactful, as data centers already account for a substantial portion of global electricity use. Cooling systems can sometimes consume as much energy as the IT equipment they are meant to cool, leading to high operational costs and a large carbon footprint;

Complex Infrastructure and Maintenance: Modern cooling systems often involve complex infrastructure, including chillers, air handlers, and specialized plumbing for liquid cooling systems. This complexity requires regular maintenance and monitoring to ensure optimal performance and prevent failures. The initial setup and ongoing maintenance of these systems require skilled technicians, adding to operational costs;

Need to Filter Outside Air: even in cases when outside air is cooler than the air inside the data center, there is a risk of encountering dust, dirt, soot, and other contaminants when using outside air for air cooling of the computer components. A significant investment may be required to equip the data center with a high-quality air filtration system to remove these contaminants from the air prior to circulating the air through the computer racks;

Need to Control Humidity of Outside Air: The use of outside air for direct air cooling is fraught with the risks caused by improper and uncontrolled humidity of the outside air. The humidity of the outside air must be maintained within a certain predefined range before that air can be allowed to enter the server's air inlet. If the humidity is too high, it could cause condensation. High humidity would also lead to the formation of hygrometric dust particles, which make dust in the air more likely to stick to electrical components in the computer. This, in turn, can reduce heat transfer and even cause corrosion of those components. If the humidity is too low, it could lead to electrostatic discharge (ESD). Treating the air by either adding or removing humidity is an expensive and environmentally unfriendly process;

Limited Scalability and Flexibility: As data centers grow and evolve, scaling traditional cooling systems can be challenging. Expanding these systems often involves significant disruption and investment. Furthermore, rigid infrastructures like ductwork and piping can limit the flexibility needed for reconfiguring server layouts as technology and demand change;

Environmental Impact: Besides high energy consumption, some cooling systems still use refrigerants that can be harmful to the environment. Although newer systems use more eco-friendly refrigerants, issues such as leaks can still pose risks to the environment;

Water Usage: Many modern cooling techniques, including liquid cooling and certain types of free cooling, rely heavily on the availability of running water. This can be a significant drawback in areas where water is scarce, posing sustainability concerns and necessitating the use of additional resources for water management;

Potential for System Failure: With the complexity of modern cooling systems, there is a heightened risk of system failure. A malfunction in one part of the cooling system can lead to overheating, which might result in downtime and potential damage to expensive IT equipment.

The need exists therefore for novel high-efficiency cooling systems for data centers and other facilities that use equipment requiring active cooling.

SUMMARY

Accordingly, it is an object of the present invention to overcome these and other drawbacks of the prior art by providing novel cooling systems and methods for managing temperature and extracting heat generated by the equipment in a data center or another facility with high efficiency and minimal environmental impact.

It is another object of the present invention to provide novel cooling systems and methods that maximize the utilization of the modern heat exchanger without the risk of returning refrigerant being too hot for the purposes of its recirculation at the refrigerant source.

It is a further object of the present invention to provide novel cooling systems and methods that maximize the efficiency of heat extraction throughout the entire pathway of the recirculating refrigerant, regardless of whether the refrigerant flows through air cooling heat exchangers or liquid-cooling heat exchangers.

It is yet a further object of the present invention to provide novel cooling systems and methods for computer data centers that improve heat extraction from multiple refrigerant pathways going through various heat exchangers throughout the entire data center facility.

According to the first aspect of the invention, a novel cooling system for a facility employing equipment requiring active cooling of the present invention may include:

a refrigerant supply line providing a refrigerant at a first pressure from a refrigerant source, a refrigerant return line directing the refrigerant at a second pressure toward the refrigerant source for cooling and recirculating of the refrigerant thereat, wherein the second pressure is lower than the first pressure, a first heat exchanger configured to use the refrigerant circulating therethrough to cool air or liquid which passes through the first heat exchanger and is used for active cooling of the equipment in the facility, the first heat exchanger having a first refrigerant inlet configured to receive at least some refrigerant from the refrigerant supply line, the first heat exchanger having a first refrigerant outlet operably connected to direct at least some refrigerant to the refrigerant return line, and a first bypass line equipped with an in-line adjustable first valve operable, when at least partially open, to allow at least some refrigerant to flow from the refrigerant supply line toward and mix with the refrigerant of the refrigerant return line without flowing through the first heat exchanger, thereby reducing the temperature of the refrigerant in the refrigerant return line to or below a preset maximum refrigerant temperature prior to reaching the refrigerant source.

The cooling system of the first aspect of the invention may further include a return line temperature sensor positioned in the refrigerant return line downstream of the first heat exchanger. This return line temperature sensor may be configured to measure refrigerant temperature in the refrigerant return line prior to reaching the refrigerant source.

The first heat exchanger of the cooling system of the first aspect of the invention may include a first outlet temperature sensor positioned at or downstream of the first refrigerant outlet. The first outlet temperature sensor may be configured to measure refrigerant temperature after passing through the first heat exchanger.

The refrigerant and/or the liquid passing through the first heat exchanger of the first aspect of the invention may be selected from a group consisting of: a one-phase refrigerant, a two-phase refrigerant, a water, and a mix of water and glycol.

The cooling system of the first aspect of the invention may further include a second heat exchanger configured to use the refrigerant circulating therethrough to cool air or liquid which passes therethrough and is also used for active cooling of the equipment of the facility. The second heat exchanger may have a second refrigerant inlet configured to receive at least some refrigerant from the refrigerant supply line. The second heat exchanger may also have a second refrigerant outlet operably connected to direct at least some refrigerant to the refrigerant return line.

Furthermore, the cooling system of the first aspect of the invention may have a second bypass line equipped with an in-line adjustable second valve. This valve may be operable, when at least partially open, to allow at least some refrigerant to flow from the refrigerant supply line toward and mix with the refrigerant of the refrigerant return line without flowing through the second heat exchanger.

In addition, the cooling system of the first aspect of the invention may include the first outlet temperature sensor positioned downstream of the first refrigerant outlet of the first heat exchanger or downstream of the second refrigerant outlet of the second heat exchanger. The facility of the first aspect of the invention may be a computer data center and the air or liquid passing through the first heat exchanger may be used for active cooling of computer equipment of the data center.

A novel method for cooling a facility employing equipment requiring active cooling, according to the first aspect of the invention, may include the following steps:

a. directing a refrigerant from a refrigerant supply line pressurized at a first pressure through a first heat exchanger, wherein the first heat exchanger is configured to use the refrigerant circulating therethrough to cool air or liquid which passes through the first heat exchanger and is used for active cooling of the equipment in the facility, b. directing the refrigerant to flow from the first heat exchanger to a refrigerant return line at a second pressure, wherein the second pressure is lower than the first pressure, and c. directing sufficient bypass flow of the refrigerant from the refrigerant supply line directly to the refrigerant return line via a first bypass line and without flowing through the first heat exchanger, thereby keeping a refrigerant temperature in the refrigerant return line at or below a preset maximum refrigerant temperature.

The novel method may further include a step of detecting a refrigerant temperature in the refrigerant return line and using thereof for adjusting the bypass flow of the refrigerant to be sufficient to not exceed the preset maximum refrigerant temperature in the refrigerant return line.

A cooling system for a facility employing equipment requiring active cooling, according to a second aspect of the invention may include:

a refrigerant supply line providing a refrigerant at a first pressure from a refrigerant source, a refrigerant return line directing the refrigerant at a second pressure toward the refrigerant source for cooling and recirculating of the refrigerant thereat, wherein the second pressure is lower than the first pressure, a first heat exchanger configured to use the refrigerant circulating therethrough to cool air or liquid which passes through the first heat exchanger and is used for active cooling of the equipment in the facility, the first heat exchanger having a first refrigerant inlet configured to receive at least some refrigerant from the refrigerant supply line, the first heat exchanger having a first refrigerant outlet operably connected to direct at least some refrigerant to the refrigerant return line, and a first recirculation line configured to direct at least some refrigerant from the first refrigerant outlet of the first heat exchanger through an in-line refrigerant pump to mix with the refrigerant from the refrigerant supply and then flow to the first refrigerant inlet of the first heat exchanger, thereby increasing the heat exchanging efficiency of the first heat exchanger by recirculating at least some refrigerant flowing therethrough.

The novel cooling system, according to the second aspect of the invention, may also include at least one temperature sensor configured to measure refrigerant temperature at the first refrigerant inlet and/or at the first refrigerant outlet of the first heat exchanger.

The novel cooling system, according to the second aspect of the invention, may also include multiple heat exchangers arranged in parallel, in series, or using a mixed arrangement. Multiple recirculation lines using in-line refrigerant pumps may be provided in various positions to cause recirculation of refrigerant to pass through one or more heat exchangers of the data center facility.

A novel cooling system for a facility employing equipment requiring active cooling, according to the third aspect of the invention, may include:

a refrigerant supply line providing a refrigerant at a first pressure from a refrigerant source, a refrigerant return line directing the refrigerant at a second pressure toward the refrigerant source for cooling and recirculating of the refrigerant thereat, wherein the second pressure is lower than the first pressure, a first heat exchanger configured to use the refrigerant circulating therethrough to cool air which passes through the first heat exchanger and is used for active cooling of the equipment in the facility, the first heat exchanger having a first refrigerant inlet configured to receive at least some refrigerant from the refrigerant supply line, the first heat exchanger having a first refrigerant outlet, a second heat exchanger configured to use the refrigerant circulating therethrough to cool liquid which passes through the second heat exchanger and is used for active cooling of the equipment in the facility, the second heat exchanger having a second refrigerant inlet fluidly connected with and configured to receive at least some refrigerant from the first refrigerant outlet of the first heat exchanger, the second heat exchanger having a second refrigerant outlet operably connected to direct at least some refrigerant to the refrigerant return line.

The cooling system for the facility may further include a first bypass line equipped with an in-line adjustable first valve operable, when at least partially open, to allow at least some refrigerant to flow from the refrigerant supply line toward and mix with the refrigerant of the refrigerant return line or the refrigerant of the second refrigerant inlet, and without flowing through the first heat exchanger.

The cooling system for the facility, according to the third aspect of the invention, may include a second bypass line equipped with an in-line adjustable second valve. The second valve may be operable, when at least partially open, to allow at least some refrigerant to flow from the first refrigerant outlet of the first heat exchanger toward and mix with the refrigerant flowing out of the second refrigerant outlet without flowing through the second heat exchanger.

The cooling system for the facility, according to the third aspect of the present invention, may include a refrigerant supply to the second heat exchanger provided in at least one of the following modes:

entirely from the refrigerant supply line, or entirely after passing through the first heat exchanger, or as a mixture of at least some refrigerant flowing directly from the refrigerant supply line and at least some refrigerant flowing after passing through the first heat exchanger.

The novel cooling system for the facility, according to the third aspect of the invention, may be provided with at least the first heat exchanger, at least the second heat exchanger, at least the first bypass line, or at least the second bypass line configured to independently adjust the refrigerant supply through the first heat exchanger and the second heat exchanger depending on the cooling needs of the facility.

The novel cooling system for the facility, according to the third aspect of the invention, may include a supplemental in-line pump positioned before the second refrigerant inlet or after the second refrigerant outlet of the second heat exchanger and configured to facilitate refrigerant flow therethrough and into the refrigerant return line.

The novel cooling system for the facility, according to the third aspect of the invention, may further include at least one pressure sensor operatively positioned at the second refrigerant inlet or at the second refrigerant outlet and configured to respectively detect a refrigerant pressure at the second refrigerant inlet or at the second refrigerant outlet.

Additionally, the cooling system for the facility may include at least one temperature sensor operatively positioned at the second inlet or operatively positioned at the second outlet of the second heat exchanger and configured to respectively detect a refrigerant temperature flowing at the second inlet or at the second outlet of the second heat exchanger.

Furthermore, the novel cooling system for the facility, according to the third aspect of the invention, may utilize the liquid circulating through the second heat exchanger and used for active cooling of the equipment in the facility, which is selected from a group consisting of: water, mixture of water and glycol, one-phase refrigerant, and two-phase refrigerant.

The novel cooling system for the facility, according to the third aspect of the invention, may include a return line temperature sensor positioned in the refrigerant return line downstream of the first and second heat exchangers. The return line temperature sensor may be configured to measure refrigerant temperature in the refrigerant return line prior to reaching the refrigerant source.

The facility of the third aspect of the invention may be a computer data center. The air passing through the first heat exchanger is used for active cooling of the computer equipment of the data center. Conversely, the liquid passing through the second heat exchanger may also be used for active cooling of the computer equipment of the data center.

A novel method for cooling a facility employing equipment requiring active cooling, according to the third aspect of the invention, may include the following steps:

a. directing at least some refrigerant from a refrigerant source via a refrigerant supply line pressurized at a first pressure through a first heat exchanger, wherein the first heat exchanger is configured to use the refrigerant circulating therethrough to cool air which passes through the first heat exchanger and is used for active cooling of the equipment in the facility, b. directing at least some refrigerant from the first heat exchanger to flow through a second heat exchanger, wherein the second heat exchanger is configured to use the refrigerant circulating therethrough to cool liquid which passes through the second heat exchanger and is used for active cooling of the equipment in the facility, wherein refrigerant supply to the second heat exchanger is provided in one of the following modes: entirely from the refrigerant supply line, or entirely after passing through the first heat exchanger, or as a mixture of at least some refrigerant flowing directly from the refrigerant supply line and at least some refrigerant flowing after passing through the first heat exchanger, and c. directing the refrigerant to flow from the second heat exchanger toward the refrigerant source via a refrigerant return line at a second pressure, wherein the second pressure is lower than the first pressure.

The method for cooling the facility, according to the third aspect of the invention, may further include a step of directing at least some refrigerant from the first refrigerant outlet of the first heat exchanger or from the refrigerant supply line to the refrigerant return line without passing through the second heat exchanger.

The cooling system for the facility, according to the fourth aspect of the invention, may include:

a refrigerant supply line providing refrigerant from a refrigerant source, a refrigerant return line directing the refrigerant toward the refrigerant source for cooling and recirculating of the refrigerant thereat, a first heat exchanger configured to use the refrigerant circulating therethrough to cool air or liquid which passes through the first heat exchanger and is used for active cooling of the equipment in the facility, and a supplemental heat exchanger fluidly connected to and positioned in-line and downstream of the first heat exchanger, the supplemental heat exchanger is configured to accept the refrigerant from the first heat exchanger for supplemental cooling thereof and directing the refrigerant toward the refrigerant return line, the supplemental heat exchanger is physically positioned at a location with an ambient temperature lower than that of the incoming refrigerant, at least at some times during operation of the facility, for example outside the facility.

The cooling system of the fourth aspect of the invention may further comprise a supplemental bypass line, which may be used to direct the refrigerant from the first heat exchanger directly to the refrigerant return line and not through the supplemental heat exchanger. This may be done when the ambient temperature outside the supplemental heat exchanger is at or higher than the refrigerant temperature coming into the supplemental heat exchanger. Suitable valves at the inlet of the supplemental heat exchanger and in the supplemental bypass line may be provided to direct the refrigerant flow either through or around the supplemental heat exchanger. One or more temperature sensors may be provided to detect the refrigerant temperature and the ambient temperature so as to operate the control system to direct the refrigerant flow appropriately.

In further embodiments, second or further heat exchangers may be provided as part of the cooling system for the facility, with the supplemental heat exchanger positioned downstream of all of the heat exchangers and prior to directing the refrigerant to the refrigerant return line.

A method of operating the cooling system, according to the fourth aspect of the invention may include steps of monitoring refrigerant temperature at the inlet of the supplemental heat exchanger and ambient temperature at the location of the supplemental heat exchanger. The method may further include a step of directing the refrigerant to flow through the supplemental heat exchanger if the refrigerant temperature is above the ambient temperature, thereby causing supplemental cooling of the refrigerant before directing thereof to the refrigerant return line or redirecting the refrigerant to flow through the first or other heat exchangers. If the refrigerant temperature is at or lower than the ambient temperature, the refrigerant may be directed to flow outside the supplemental heat exchanger and through a supplemental bypass line.

The system and method of the fourth aspect of the invention are directed to further increase energy efficiency while operating the cooling system of the facility by utilizing natural passive cooling and reducing the energy required for active cooling of the refrigerant as much as possible.

The cooling system for the facility, according to the fifth aspect of the invention, may include:

a refrigerant supply line providing refrigerant from a refrigerant source, a refrigerant return line directing the refrigerant toward the refrigerant source for cooling and recirculating of the refrigerant thereat, a refrigerant circulation loop comprising a first heat exchanger configured to use the refrigerant circulating therethrough to cool air or liquid which passes through the first heat exchanger and is used for active cooling of the equipment in the facility, a refrigerant circulation pump, and a refrigerant mixing tank, wherein the refrigerant circulation pump is configured to withdraw the refrigerant from the refrigerant mixing tank, flow the refrigerant through the first heat exchanger and return the refrigerant to the refrigerant mixing tank, wherein the cooling system is further configured to direct the refrigerant from the refrigerant supply line to the refrigerant mixing tank and to direct the refrigerant from the refrigerant tank to the refrigerant return line, thereby the refrigerant mixing tank serves to mix refrigerant from the first heat exchanger with refrigerant from the refrigerant supply line to extract heat from the first heat exchanger into the refrigerant directed to the refrigerant return line.

In further embodiments, the refrigerant circulation loop may comprise a second of further heat exchangers.

BRIEF DESCRIPTION OF THE DRAWINGS

Subject matter is particularly pointed out and distinctly claimed in the concluding portion of the specification. The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION OF PREFERRED EMBODIMENTS OF THE INVENTION

Figure 1:
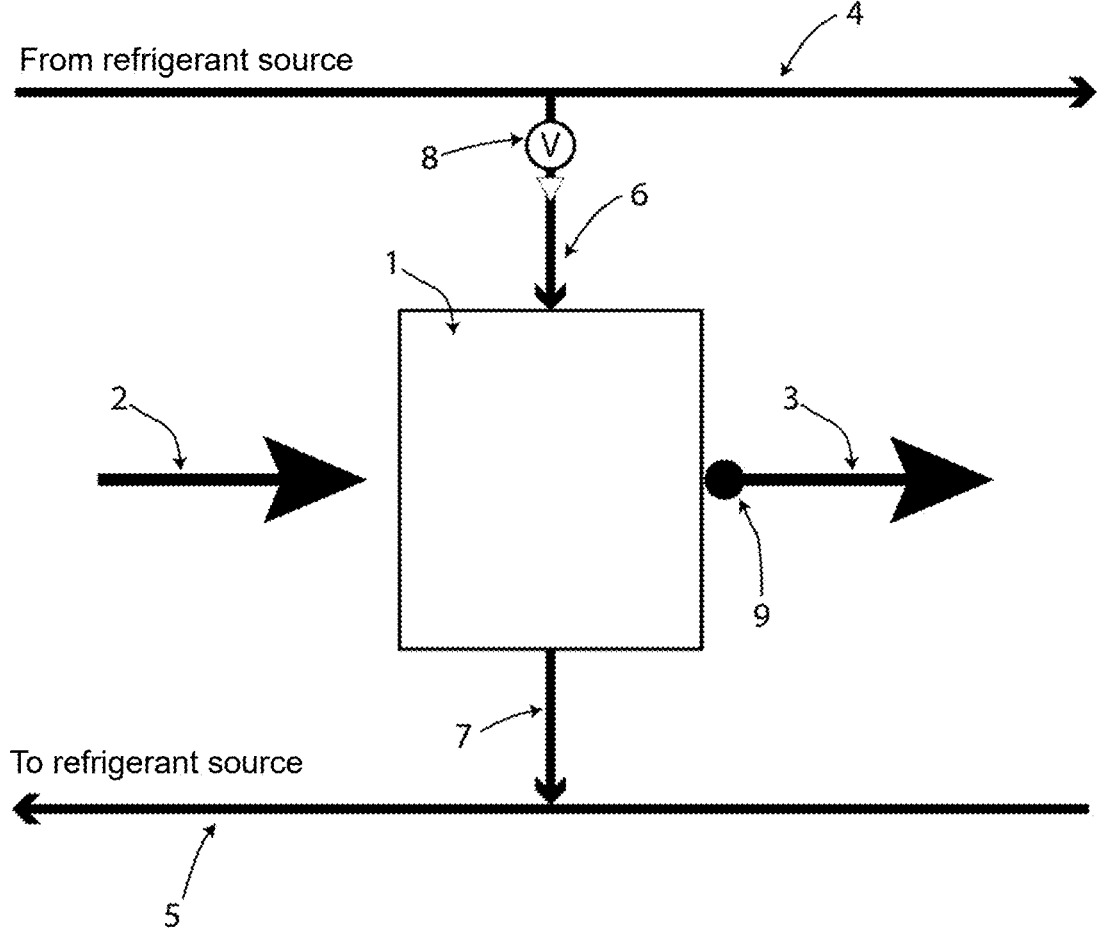
FIG. 1 is a schematic view of the prior art heat exchanger used in a data center.

The following description sets forth various examples along with specific details to provide a thorough understanding of claimed subject matter. It will be understood by those skilled in the art, however, that claimed subject matter may be practiced without one or more of the specific details disclosed herein. Further, in some circumstances, well-known methods, procedures, systems, components and/or circuits have not been described in detail in order to avoid unnecessarily obscuring claimed subject matter. In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

The first aspect of the invention is now described in greater detail and with reference to FIGS. 1-6. Facilities using equipment requiring active cooling, such as computer data centers, may use a variety of refrigerants recirculating through one or more heat exchangers. These heat exchangers, in turn, are used to cool the air or liquid passing therethrough and then direct the cooled air or liquid to flow over the computer components for the purpose of extracting the heat generated by the equipment. The computer equipment is kept cool and within the temperature range necessary for continuous operation.

Recirculating chilled water is one typical example of such refrigerant. Data centers employing chilled water systems for thermal management of computer-generated heat typically operate with a water temperature in the refrigerant supply line of between about 7° C. and 12° C. Within the data center, this chilled water enters one or more heat exchangers, where it absorbs heat from the air, consequently elevating the water temperature by approximately 5° C. The resultant heated water, now ranging from 12° C. to 17° C., exits the heat exchanger and is directed to the refrigerant return line.

FIG. 1 shows a typical example of the system of the prior art. The refrigerant, in this case chilled water, may be supplied from the refrigerant source (not shown) via a refrigerant supply line 4 providing a refrigerant at a first pressure. Also shown in FIG. 1 is a refrigerant return line 5 directing the refrigerant at a second pressure toward the refrigerant source for cooling and recirculating thereat. The second pressure may be lower than the first pressure, so as to urge the chilled water to pass through the first heat exchanger and to proceed from the refrigerant supply line 4 to the refrigerant return line 5.

A first heat exchanger 1 may be configured to use the chilled water circulating therethrough to cool air which passes therethrough from the inlet airflow 2 to the outlet airflow 3. The cool outlet airflow 3 may be directed and used for active cooling of the equipment in the facility. The first heat exchanger 1 may include a first refrigerant inlet 6 configured to receive the refrigerant from the refrigerant supply line 4, and a first refrigerant outlet 7 operably connected to direct the refrigerant to the refrigerant return line 5.

Additional optional components of the prior art may include a variable valve 8 which may be equipped with a flow meter to control how much water from facilities enters the first heat exchanger 1. A temperature sensor 9 may be positioned, for example, to measure the temperature of the outlet airflow 3. The reading of that temperature may be used to operate the variable valve 8 and keep the temperature of the outlet airflow at a desired level.

The warm water in the refrigerant return line 5 may then be circulated back to the compressor or water chiller (not shown) for re-cooling, therefore facilitating recirculation and a repeat of this thermal management cycle. Chillers in these systems are generally constrained to handle a maximum incoming water temperature of 20° C. due to limitations related to oil return and motor cooling functions. Exceeding this temperature threshold can trigger an automatic chiller shutdown, a critical issue for continuously operational data centers, as the restarting of large chillers can span a considerable amount of time, potentially leaving computing hardware at risk of overheating, service disruption, and damage.

Advanced heat exchangers are capable of significantly increasing the temperature of water in the refrigerant return line, potentially reaching up to 35° C., a level that exceeds standard chiller tolerance. This poses a challenge when integrating such high-efficiency heat exchangers with traditional chiller systems not designed to accommodate such elevated temperatures.

The first aspect of the invention is designed to address this issue and allow maximum use of modern high-efficiency heat exchangers in the context of temperature management of a data center. The present invention describes the deployment of a control system that dynamically adjusts the temperature of the water flowing through the refrigerant return line back to the refrigerant source, in this case, the water chiller. This system may be governed by a computerized control mechanism, allowing seamless temperature modulation in response to the chiller's operational demands or changes in facility requirements. This adaptation ensures compatibility with both current and future chiller models that may support higher inlet temperatures.

Figure 2:
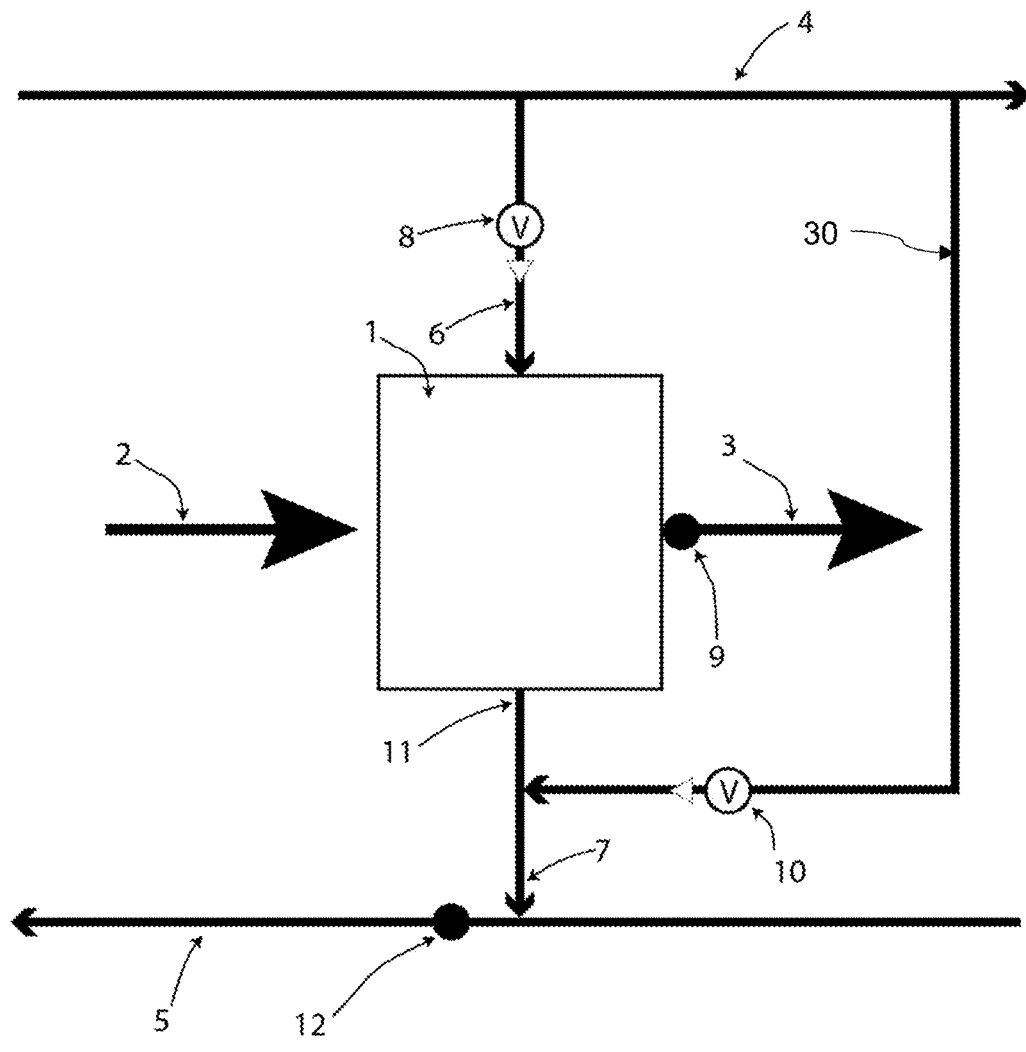
FIG. 2 is a schematic view of a basic configuration of the cooling system according to the first aspect of the present invention.

The most basic configuration of the first aspect of the present invention is seen in FIG. 2 and includes a first bypass line 30 equipped with an in-line adjustable first valve 10. The first valve 30 may be configured to be operable in such a manner that when at least partially open, it allows at least some refrigerant to flow from the refrigerant supply line 4 directly toward and mix with the refrigerant of the first heat exchanger outlet 11 or the refrigerant in the refrigerant return line 5—and without flowing through the first heat exchanger 1. This may be done to reduce the temperature of the refrigerant in the refrigerant return line 5 to or below a preset maximum refrigerant temperature prior to reaching the refrigerant source, such as the water chiller (not shown in the drawings).

As can be appreciated by those skilled in the art, the origin of the first bypass line 30 may be located anywhere along the refrigerant supply line, both before and after the point where the refrigerant is directed to the first heat exchanger 1. It may also be located on the part of the refrigerant supply line directing the refrigerant to the first heat exchanger 1, such as anywhere prior to the first refrigerant inlet 6 or the variable valve 8, as the invention is not limited in this regard.

Similarly, the endpoint of the first bypass line 30 may be located at any part of the refrigerant return line 5, before or after the point where the refrigerant is flowing from the first heat exchanger. It may also be located on the refrigerant return line connecting the first refrigerant outlet 11 with the refrigerant return line 5, as the invention is not limited in this regard.

The first valve 10 may not only have the capability of adjusting the flow of refrigerant therethrough but may also include a flowmeter and/or a temperature sensor to monitor the flow and temperature of the refrigerant flowing therethrough.

A further useful element of the first aspect of the present invention is a return line temperature sensor 12 positioned in the refrigerant return line 5 downstream of the first heat exchanger 1. In embodiments, the return line temperature sensor 12 may be configured to measure refrigerant temperature in the refrigerant return line 5 prior to reaching the refrigerant source, such as a water chiller. If the temperature of the refrigerant in the return line 5 is at or below the preset maximum refrigerant temperature, the first valve may be left alone or slightly closed so as to improve the overall energy efficiency of the cooling system. If the temperature detected by the return line temperature sensor 12 exceeds the preset refrigerant temperature in the return line 5, the first valve 10 may be adjusted to allow a greater flow of the refrigerant to go in the first bypass line 30 around the first heat exchanger 1 so as to mix and further cool the refrigerant temperature in the refrigerant return line 5.

An automated control system may be used to operate the first valve 10 in such a manner as to maintain the refrigerant temperature in the return line 5 at the maximum preset level. Maintaining the refrigerant temperature at the maximum preset level assures proper operation of the refrigerant chiller on one side, and minimal or no flow of refrigerant from the supply line 4 directly to the return line 5, thereby minimizing the energy consumption of the entire cooling system of the present invention. The automated system may respond to various input signals, such as the temperature sensor readings from temperature sensors 9 and 12. Furthermore, such an automated system may operate on its own without further input or in addition to various adjustments of the flow speed of airflow 3 passing through the first heat exchanger 1, as well as natural fluctuations of the ambient temperature in the facility.

In the cooling of data centers, various types of refrigerants are employed, each offering distinct advantages and facing specific limitations. These include one-phase refrigerants, two-phase refrigerants, water, and mixtures of water and glycol, all of which may be useful for the purposes of the present invention.

One-phase refrigerants, are commonly used in traditional vapor-compression refrigeration cycles. These refrigerants operate in a single phase (gaseous or liquid) under operational conditions inside the cooling system. They are effective in transferring heat due to their stable thermodynamic properties. The primary advantage of one-phase refrigerants is their consistent performance and relatively straightforward system design and maintenance requirements.

Two-phase refrigerants, such as R-410A, operate by transitioning between liquid and vapor phases, which can enhance the heat transfer efficiency significantly. This property makes them highly effective for use in heat pump applications and high-load environments like data centers. The primary advantage of two-phase refrigerants is their ability to absorb large amounts of heat when they evaporate. However, they also face challenges such as requiring more complex control systems to manage phase changes and pressures, and they may also have higher global warming potentials compared to some newer alternatives.

Water is a highly effective coolant and is used extensively in data center cooling, especially in chilled water systems. Its high specific heat capacity enables efficient heat absorption and transfer. Water is non-toxic, inexpensive, and readily available, making it an environmentally friendly option. However, the use of water in cooling systems necessitates corrosion-resistant materials and can involve significant energy consumption for pumping and treatment processes to maintain purity and prevent scaling and biological growth.

Mixtures of water and glycol, particularly ethylene or propylene glycol, are used to lower the freezing point of the coolant, allowing for chilled water systems to operate in colder climates without the risk of freezing. These mixtures also retain most of the high heat capacity characteristics of water. The presence of glycol enhances the anticorrosive and antifreeze properties of the coolant mixture. However, the addition of glycol reduces the heat transfer efficiency compared to pure water and increases the viscosity, which can require more energy for pumping. Furthermore, glycols need to be handled carefully as they can be toxic and require proper disposal and treatment.

In water-based chiller systems, a variety of other additives may be employed to optimize performance and maintain the integrity of the system components. One example is corrosion inhibitors such as phosphates, nitrites, and molybdates which may be crucial for reducing the oxidation and corrosion of metal parts. Another example is scale inhibitors, like polyphosphates, which help prevent the accumulation of mineral scale which can impair heat transfer and lead to blockages. To control microbial growth that can cause fouling and reduce efficiency, biocides may be utilized; these include both oxidizing agents like chlorine and bromine, and non-oxidizing compounds such as isothiazolones. For systems operating in colder climates, antifreeze agents such as ethylene or propylene glycol may be added to prevent the coolant from freezing. Furthermore, pH buffers may also be added for neutralizing acids and maintaining a stable pH level, typically managed with additives like sodium or potassium hydroxide. Additionally, dispersants may help keep particulate matter suspended within the coolant, preventing deposition and system fouling. Each additive may be carefully selected and managed based on the chiller's operational conditions and the characteristics of the water used, necessitating consistent monitoring and maintenance to ensure system efficacy and longevity. All of these and other suitable additives may be used for the purposes of the present invention.

While FIG. 2 shows one first heat exchanger 1 and its corresponding connections to the supply line 4 and the return line 5, the present invention is not limited to that. In fact, additional heat exchangers may be also used, such as when forming parallel branches of the cooling lines extending between the supply line 4 and the return line 5. In this case, the first bypass line may be positioned to connect the refrigerant supply line 4 to any point along the return line 5. In some embodiments, the first bypass line may terminate at a point downstream of all heat exchangers used in the cooling system but before the location of the return line temperature sensor 12. Refrigerant flow through the first bypass line 30 may be used to adjust (lower) the refrigerant temperature in the return line after the refrigerant passes through all active heat exchangers of the cooling system of the present invention.

In further embodiments, not shown in the drawings, additional bypass lines may be used to connect the supply line 4 directly to the return line 5 at various points thereof. Such additional bypass lines may be equipped with their own in-line adjustable valves configured to manually or automatically adjust the extent of refrigerant flow through some or all of the bypass lines used in the cooling system of the invention. In addition, the cooling system may be equipped with further flow and temperature sensors so as to achieve a balanced heat extraction and maximize heat heat-exchanging efficiency of the system overall.

In addition to a novel cooling system, the present invention describes a novel method for cooling a facility employing equipment requiring active cooling. This method may include the following steps:

a. directing a refrigerant from a refrigerant supply line 4 pressurized at a first pressure through a first heat exchanger 1, wherein the first heat exchanger 1 is configured to use the refrigerant circulating therethrough to cool air or liquid which passes through the first heat exchanger 1 and is used for active cooling of the equipment in the facility, b. directing the refrigerant to flow from the first heat exchanger 1 to a refrigerant return line 5 at a second pressure, wherein the second pressure is lower than the first pressure, and c. directing sufficient bypass flow of the refrigerant from the refrigerant supply line 4 directly to the refrigerant return line 5 via a first bypass line 30 and without flowing through the first heat exchanger 1, thereby keeping a refrigerant temperature in the refrigerant return line 5 at or below a preset maximum refrigerant temperature.

The novel method may further include a step of detecting a refrigerant temperature in the refrigerant return line 5 and in various other locations throughout the cooling system. These measurements may be used for automated adjusting the bypass flow of the refrigerant—so as to be sufficient to have the refrigerant temperature not exceed the preset maximum refrigerant temperature in the refrigerant return line 5.

In further embodiments, the cooling system of the first aspect of the invention may include additional heat exchangers, for example, a second heat exchanger configured to use the refrigerant circulating therethrough to cool air or liquid which passes therethrough and is also used for active cooling of the equipment of the facility. The second heat exchanger (and additional heat exchangers) may have a respective second and more refrigerant inlets configured to receive at least some refrigerant from the refrigerant supply line. The second or more heat exchangers may also have second or more refrigerant outlets operably connected to direct at least some refrigerant to the refrigerant return line.

Furthermore, the cooling system of the first aspect of the invention may have a second (or more) bypass line equipped with an in-line adjustable second valve. This valve may be operable, when at least partially open, to allow at least some refrigerant to flow from the refrigerant supply line toward and mix with the refrigerant of the refrigerant return line without flowing through the second heat exchanger.

In addition, the cooling system of the first aspect of the invention may include the first outlet temperature sensor positioned downstream of the first refrigerant outlet of the first heat exchanger or downstream of the second refrigerant outlet of the second heat exchanger.

Figure 3:
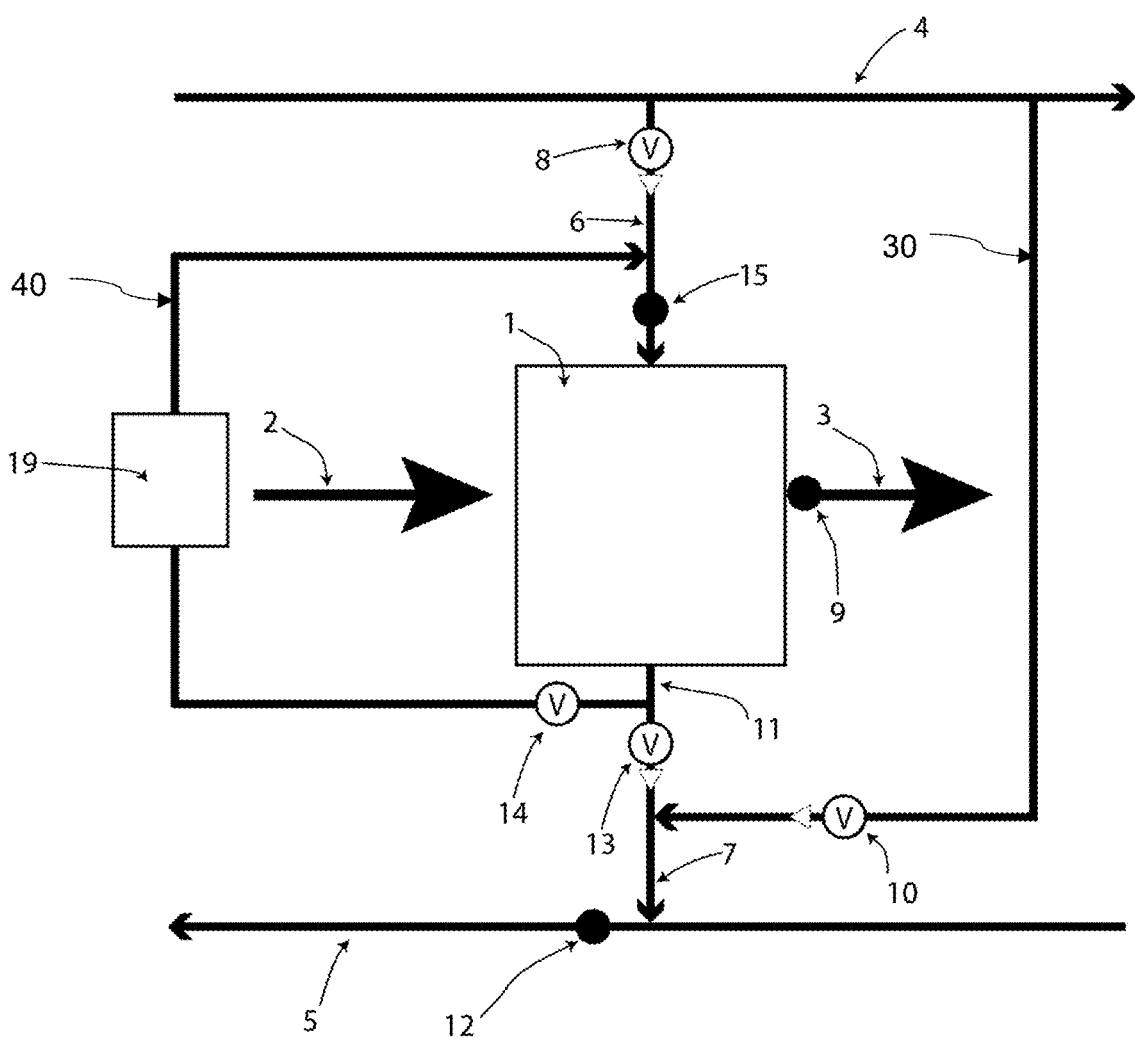
FIG. 3 is a schematic view of a configuration of the cooling system according to the first aspect and the second aspect of the present invention.

FIG. 3 shows an exemplary configuration of the cooling system of the present invention representing a combination of the first aspect described above and a second aspect of the invention. In addition to the components shown and described in FIG. 2, the system shown in FIG. 3 includes a first recirculation line 40 configured to direct at least some refrigerant from the first refrigerant outlet 11 of the first heat exchanger 1 through an in-line refrigerant pump 19 to mix with the refrigerant from the refrigerant supply line 4 and then flow to the first refrigerant inlet 6 of the first heat exchanger 1. The first recirculation line 40 may be used to increase the heat exchanging efficiency of the first heat exchanger 1 by recirculating at least some refrigerant flowing therethrough.

The novel cooling system, according to the second aspect of the invention, may also include at least one temperature sensor 15 configured to measure refrigerant temperature at the first refrigerant inlet 6. In further embodiments, another temperature sensor may also be added at the first refrigerant outlet 11 of the first heat exchanger 1.

In addition, an adjustable recirculation valve 14 may be added to the first recirculation line 40. This valve may be used to adjust the refrigerant flow therethrough. Flow adjustment may also be made by adjusting the refrigerant pump 19. Moreover, the temperature sensor 15 may also be used to control valve 14 or the variable speed pump 19. In embodiments, the temperature of the refrigerant in line 6 may be raised in order to avoid condensation in the first heat exchanger 1. This may provide an additional benefit of controlling the condensation by keeping the refrigerant temperature at the first refrigerant inlet above the dew point.

Furthermore, a first refrigerant outlet valve 13 may be placed at the first refrigerant outlet of the first heat exchanger 1. The position of this valve may be downstream of the intake line of the first recirculation line 40. The valve 13 may be operated to adjust the ratio of refrigerant flow out of the first heat exchanger—with more or less flow directed to the first recirculation line or to the refrigerant return line 5.

The novel cooling system, according to the second aspect of the invention, may also include multiple heat exchangers arranged in parallel, in series, or using a mixed arrangement. Multiple recirculation lines using in-line refrigerant pumps may be provided in various positions to cause the recirculation of refrigerant to pass through one or more heat exchangers of the data center facility.

The automated control system may be provided to monitor temperatures, flows, and pressures throughout the cooling system and adjust the flows directed to various points of the system depending on (i) the cooling needs of the data center, and (ii) to maximize heat extraction efficiency of the system.

Figure 4:
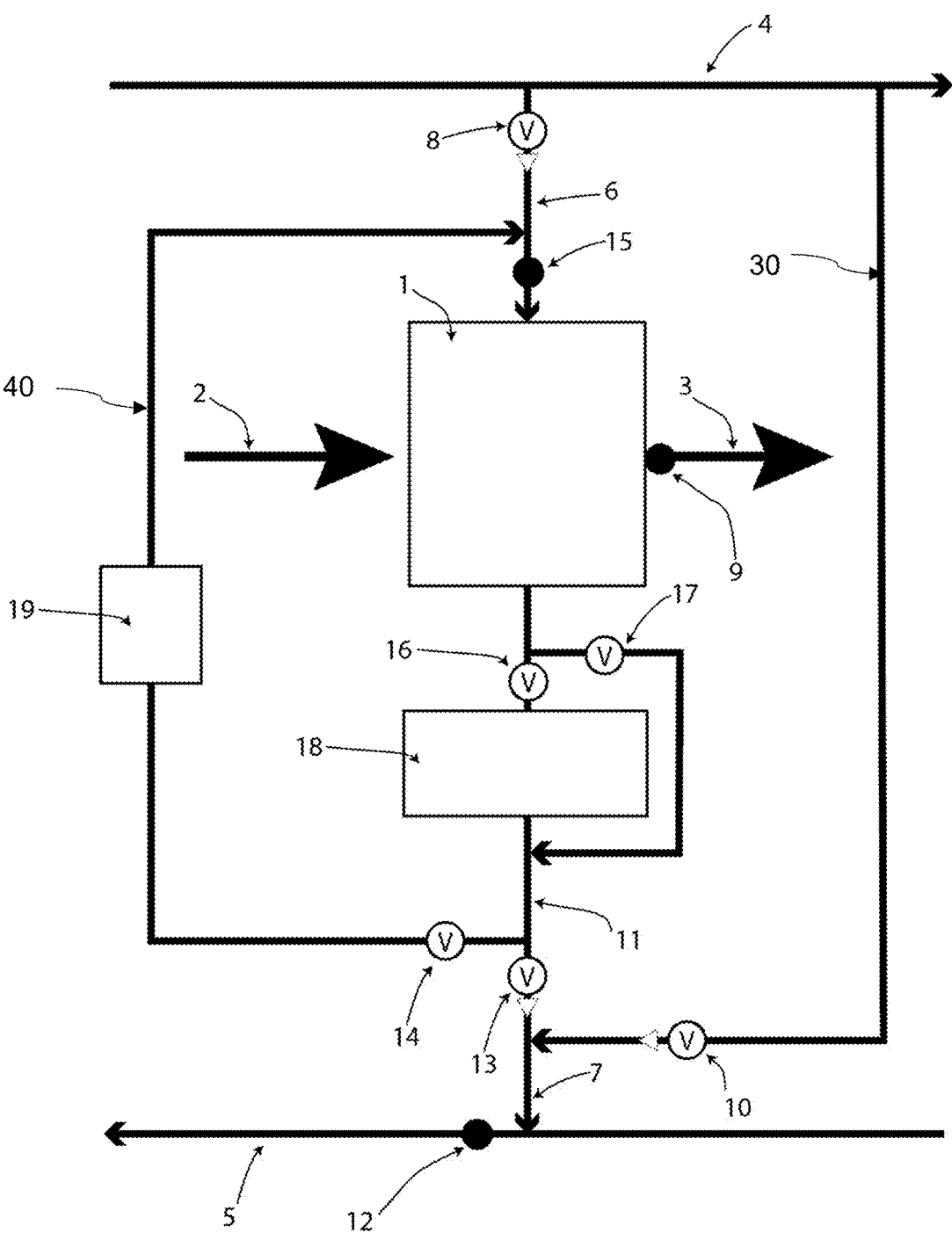
FIG. 4 is a schematic view of an alternative configuration of the cooling system of the invention.
Figure 13:
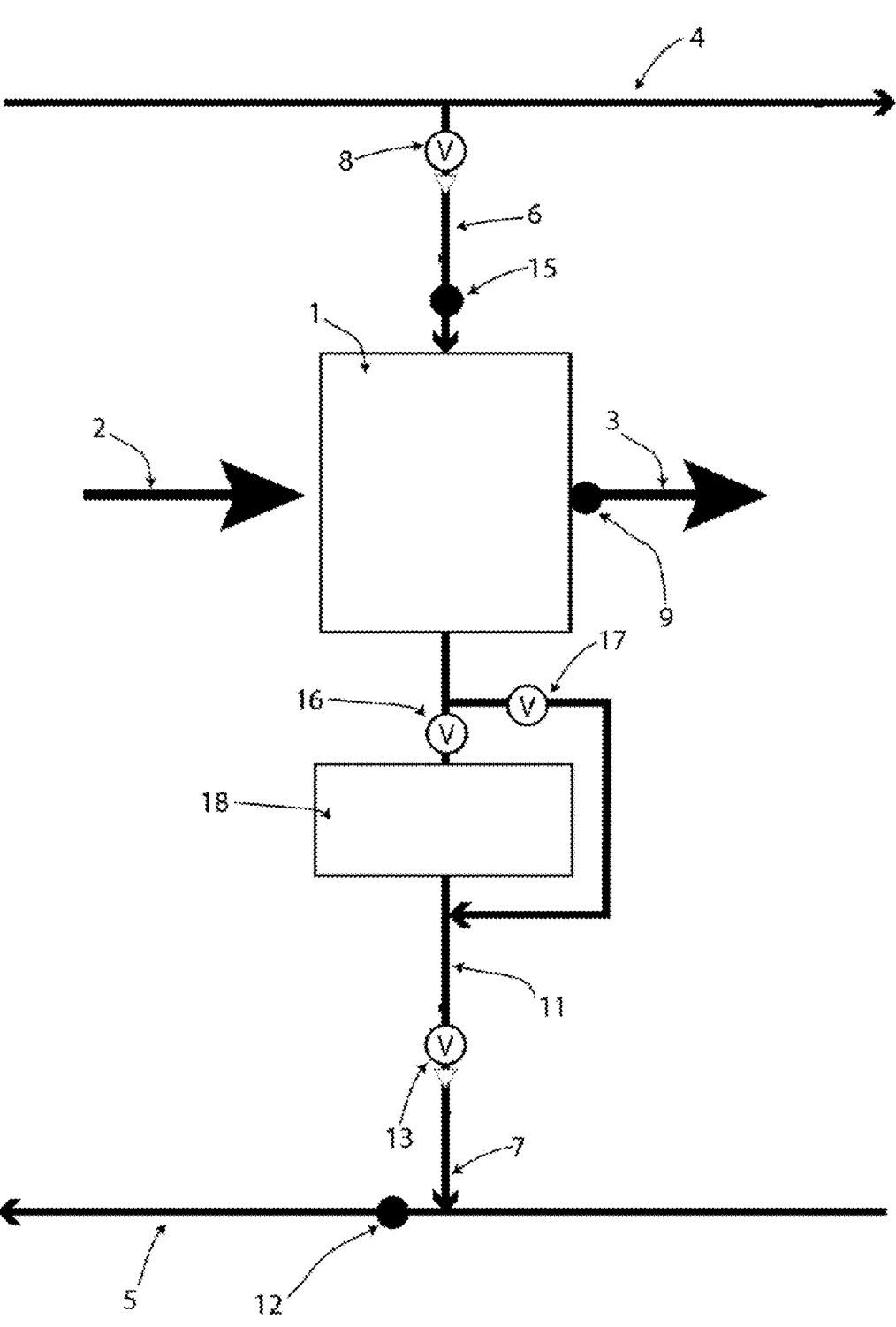
FIG. 13 shows a schematic view of the cooling system or the fourth aspect of the invention.

FIG. 4 shows a further yet alternative configuration of the high-efficiency cooling system of the present invention. The most basic configuration of that system is seen in FIG. 13. In circumstances where the temperature of the refrigerant coming out of the first heat exchanger 1 exceeds the ambient temperature at a location nearby, such as in a different area of the facility or outside the data center, an externally positioned supplemental heat exchanger 18 may be used to provide supplemental cooling for the refrigerant before it is either directed to the refrigerant return line 5 or, at least partially recirculated back into the first refrigerant inlet 6 of the first heat exchanger 1. In embodiments, this condition may be encountered during certain times of the day, for example at night, or during certain annual periods, such as during the winter. Valves 16 and 17 may be used to either direct the refrigerant to flow through the supplemental external heat exchanger 18 or, when the ambient temperature exceeds the refrigerant temperature coming out of the first heat exchanger, valve 16 may be closed and valve 17 may be open to bypass the supplemental heat exchanger. In this case, the cooling system of FIG. 3 would operate similarly to the cooling system of FIG. 2. In situations where the cooling system operates multiple first heat exchangers 1, valves 16 and 17 may also be used to limit the flow through supplemental heat exchanger 18 in case the flow of refrigerant exiting one or more first heat exchangers 1 is more than the refrigerant flow capacity of supplemental heat exchanger 18. This approach allows to save energy by passively extracting heat from the refrigerant using natural conditions, before directing the refrigerant for active cooling which uses energy. One or more temperature sensors may be positioned at the inlet of the supplemental heat exchanger and outside the facility to measure ambient temperature. Signals from these temperature sensors may be used by the automated control system to intelligently decide whether to direct the refrigerant flow through the supplemental heat exchanger 18 or outside thereof.

In further embodiments, more than one heat exchanger may be present in the portion of the cooling system and may be connected in parallel or in series before the refrigerant therefrom is directed downstream to the supplemental heat exchanger 18, as the invention is not limited in this regard.

Figure 5:
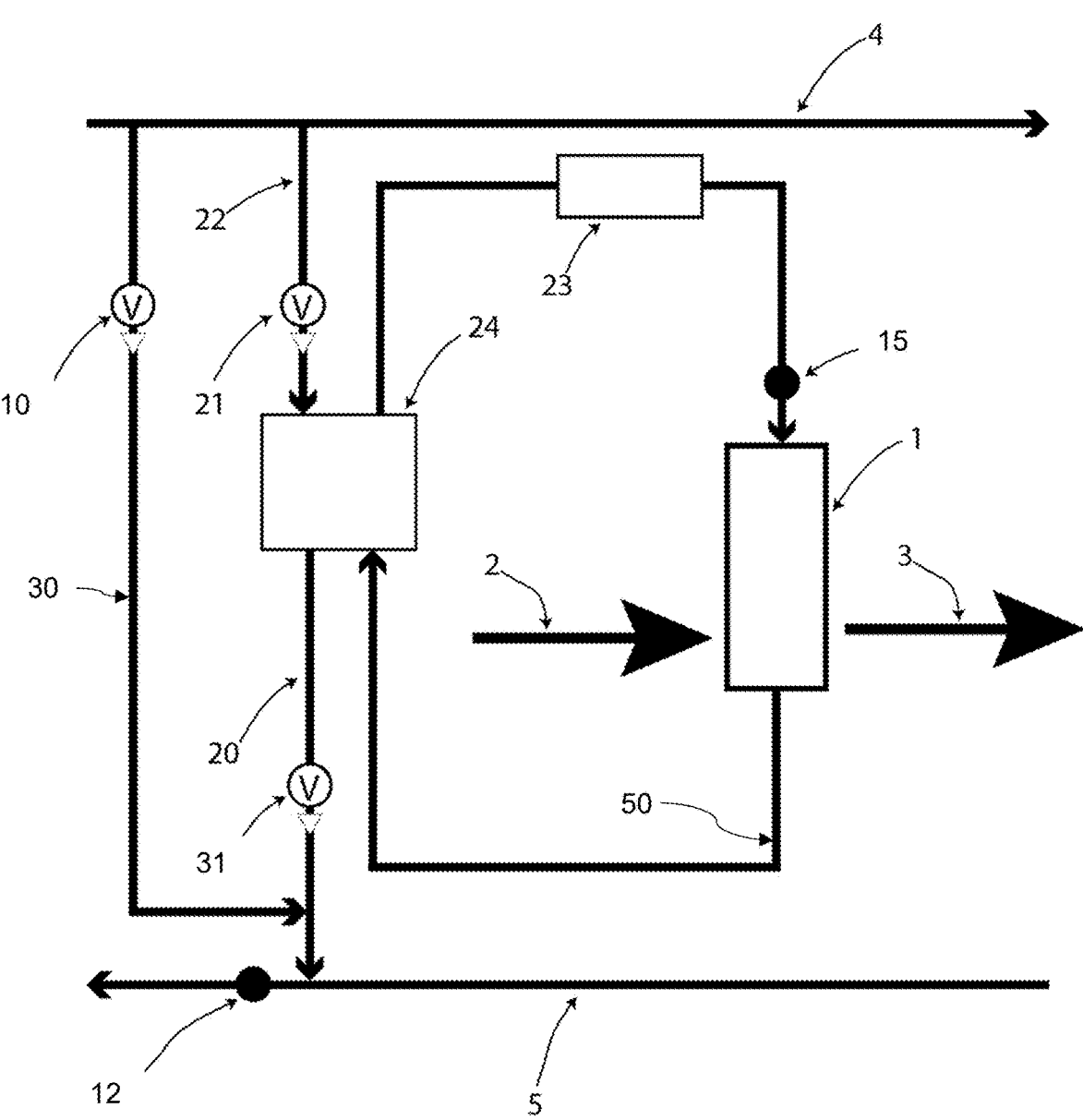
FIG. 5 is a schematic view of another alternative configuration of the cooling system of the invention.
Figure 14:
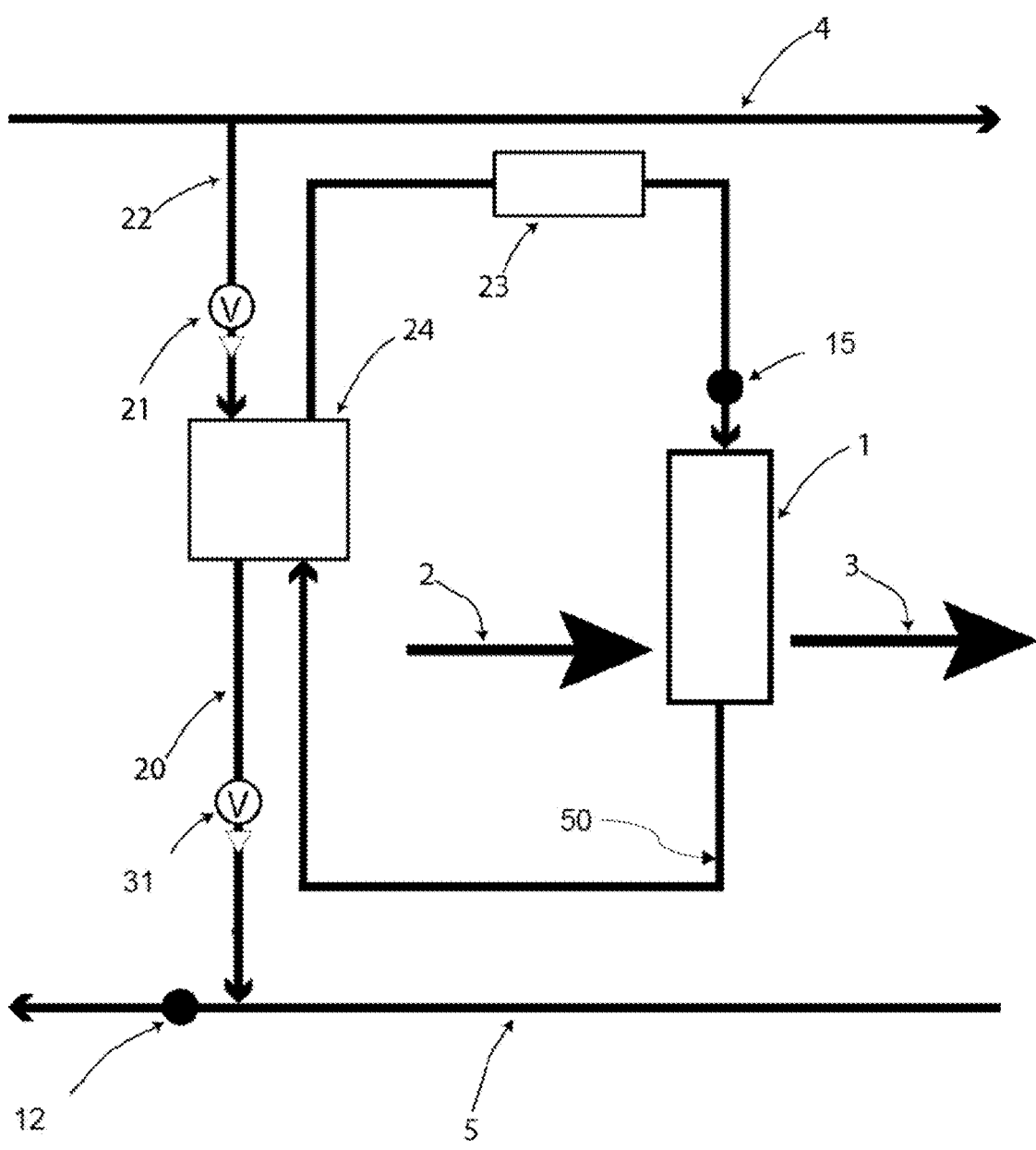
FIG. 14 shows a schematic view of the cooling system of the fifth aspect of the invention.

FIG. 5 shows a further alternative configuration of the cooling system of the present invention, seen in its most basic form in FIG. 14. In this configuration, the first heat exchanger 1 does not receive the refrigerant directly from the refrigerant supply line 4. Also, the refrigerant does not proceed to the refrigerant return line 5 after passing through the first heat exchanger 1. Instead, a refrigerant circulation loop 50 is provided to feed the cooler refrigerant into the first refrigerant inlet of the first heat exchanger 1 and to remove the refrigerant from the first refrigerant outlet thereof.

The refrigerant in the first refrigerant circulation loop 50 may be urged to circulate with the help of a refrigerant circulation pump 23. The refrigerant circulation pump 23 may be positioned anywhere along the circulation loop 50, both prior to and after the first heat exchanger 1. The refrigerant circulation loop 50 may be configured to direct the refrigerant toward and through the first heat exchanger 1 using the in-line refrigerant circulation pump 23. The cooling system may further feature a refrigerant mixing tank 24 in fluid communication with the refrigerant supply line 4, the refrigerant return line 5, an inlet of the refrigerant circulation loop 50, and an outlet of refrigerant circulation loop 50. The refrigerant mixing tank 24 may be configured to extract heat from the refrigerant coming out of the first heat exchanger 1 by mixing thereof with the refrigerant coming from the refrigerant supply line 4. More specifically, mixing of the refrigerant coming in from both the refrigerant supply line 4 and from the refrigerant circulation loop 50 together with the refrigerant coming out of the refrigerant mixing tank 24 toward the return line 5 and to the refrigerant circulation loop 50 (as urged by the circulation pump 23) may be useful to cool the refrigerant in the mixing tank 24 to cool, thereby extracting heat from the first heat exchanger 1.

Adjustable incoming valve 21 or/and outgoing valve 31 may be provided to adjust the flow of refrigerant directed toward and away from the refrigerant mixing tank 24. The incoming valve 21 may be positioned upstream of the refrigerant mixing tank. The outgoing valve 31 may be positioned downstream thereof. One or both of these valves may be adjusted to increase or decrease the flow of refrigerant and the mixing of refrigerant from the refrigerant circulation loop 50 with the cooler refrigerant from the refrigerant supply line 4 as needed, so as to maximize the heat-exchanging efficiency of the cooling system of the invention.

As in previous configurations, a first bypass line 30 with a first valve 10 may be provided to keep the temperature of the refrigerant in the return line 5 at or below the preset maximum temperature value.

In further embodiments, the refrigerant circulation loop 50 may contain additional heat exchangers, that may be connected to each other in parallel or in series, prior to directing the refrigerant flow back to the refrigerant mixing tank 24, as the invention is not limited in this regard.

Figure 6:
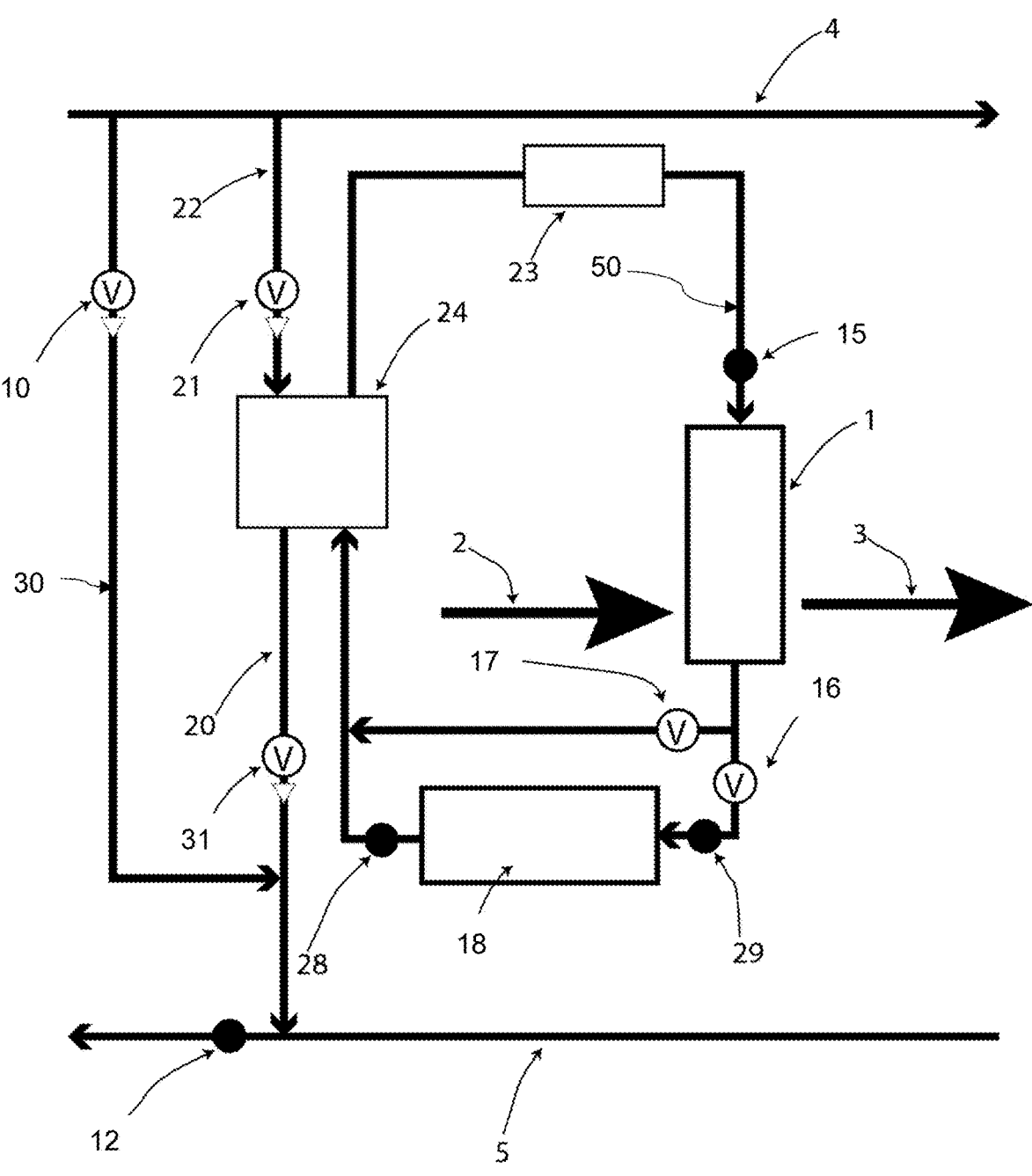
FIG. 6 is a schematic view of yet another alternative configuration of the cooling system of the invention.

FIG. 6 illustrates a further configuration of the cooling system of the present invention. The difference between this configuration and the configuration described above with reference to FIG. 5 is the addition of the externally positioned supplemental heat exchanger 18 positioned in the refrigerant circulation loop 50 downstream of the first heat exchanger 1. The use of the supplemental heat exchanger 18 may be beneficial to cool the refrigerant coming out of the first heat exchanger 1 if the ambient conditions are favorable, in that the outside temperature is below the temperature of the refrigerant at the first refrigerant outlet of the first heat exchanger. The supplemental heat exchanger 18 may be positioned and used to extract at least some heat from the refrigerant in this part of the refrigerant circulation loop 50, and at least during the cooler parts of the day, for example when operating at night.

At least one or, in some embodiments, two refrigerant temperature sensors may be used to control the operation of the supplemental heat exchanger 18: the inlet temperature sensor 29 placed prior to the supplemental heat exchanger or/and the outlet temperature sensor 28 placed after thereof in the circulation loop 50.

If the ambient temperature rises above the refrigerant temperature as measured by the inlet temperature sensor 29, circulation bypass valve 17 may be closed and the supplemental heat exchanger valve 16 may be opened so as to direct the refrigerant to flow through the supplemental heat exchanger 18 and extract at least some heat therefrom before reaching the refrigerant mixing tank 24. If the ambient temperature rises above the refrigerant temperature at the first refrigerant outlet of the first heat exchanger 1, valve 16 may be closed and valve 17 may be opened to skip circulating the refrigerant through the external supplemental heat exchanger 18 and direct the refrigerant through the circulation bypass line of valve 17. The refrigerant from the first heat exchanger 1 would be flowing directly through the circulation bypass line to the refrigerant mixing tank 24. Valves 16 and 17 may be simple ball valves that may be manually or automatically operated to open or close based on the command from the automatic control center of the cooling system of the present invention. In embodiments, a dedicated ambient temperature sensor, not shown, may be used to measure the ambient temperature and provide this measurement to the automated control system of the invention.

The remaining configuration and operation of the cooling system in FIG. 6 may be similar to that described with reference to FIG. 5.

The third aspect of the invention is illustrated in FIGS. 7-12 and discusses cooling systems and methods of maximizing heat extraction for a data center using both air-cooled computer equipment and liquid-cooled computer equipment. Liquid cooling is an advanced thermal management technique employed in computing systems to efficiently dissipate heat generated by electronic components, notably central processing units, graphics processing units, and high-performance computer servers. Unlike traditional air cooling which relies on airflow proceeding passively or directed by fans to remove heat from computer racks, liquid cooling utilizes a fluid, typically water or a specially formulated liquid coolant, to absorb and transfer heat away from critical components more effectively.

Various liquids may be utilized as coolant liquids in computer cooling systems to effectively remove heat from essential components. Distilled water is popular for its high thermal conductivity and cost-effectiveness, although it can become electrically conductive over time. Solutions of propylene glycol or ethylene glycol mixed with water are also used; propylene glycol is favored for its lower toxicity and safety, while ethylene glycol offers superior heat transfer capabilities but is toxic, suitable for more controlled environments. Dielectric fluids like fluorocarbons (e.g., 3M Novec and Fluorinert) are preferred in high-voltage or particularly sensitive setups due to their non-conductive nature, making them ideal for direct immersion cooling systems where components are fully submerged. Additionally, water-based coolants often include corrosion inhibitors and biocides to prevent corrosion and biological growth, respectively. Nanofluids, which are suspensions of nanoparticles in a base fluid, are at the cutting edge of coolant technology, offering enhanced thermal properties, though they are less common in everyday systems because of their higher costs and complex handling requirements. As before, one-phase refrigerants and coolants, as well as two-phase refrigerants may also be used for that purpose, as the invention is not limited in this regard. The selection of a coolant typically depends on balancing factors such as thermal efficiency, safety, maintenance needs, and overall system design constraints.

The core mechanism of liquid cooling involves circulating the liquid through a closed-loop heat-exchanging system. This loop includes a liquid block, a heat exchanger, a liquid pump, and connecting tubes or hoses. The liquid block, made from thermally conductive materials like copper or aluminum, may be mounted directly onto the heat-generating component. The liquid flows through the liquid block where it absorbs heat, becoming warmer in the process. The heated liquid is then pumped through hoses to a heat exchanger, where it is cooled by a refrigerant flow. The cooled liquid then recirculates back to the components to absorb more heat, completing the cycle.

Liquid cooling is favored in high-performance and overclocking scenarios due to its superior cooling efficiency compared to air cooling. It can maintain lower temperatures even under substantial thermal loads, thus enhancing the performance and longevity of the computer components. Additionally, liquid cooling systems are often quieter, as they do not require numerous or high-speed fans. Despite its advantages, liquid cooling is more complex to install and maintain, and it carries the risk of leaks, which can potentially damage hardware.

Some facilities may use both air cooling and liquid cooling for the thermal management of their computer hardware. The third aspect of the invention describes various configurations of the cooling system that may be designed to extract heat from the equipment using a combination of air- and liquid-handling heat exchangers.

Figure 7:
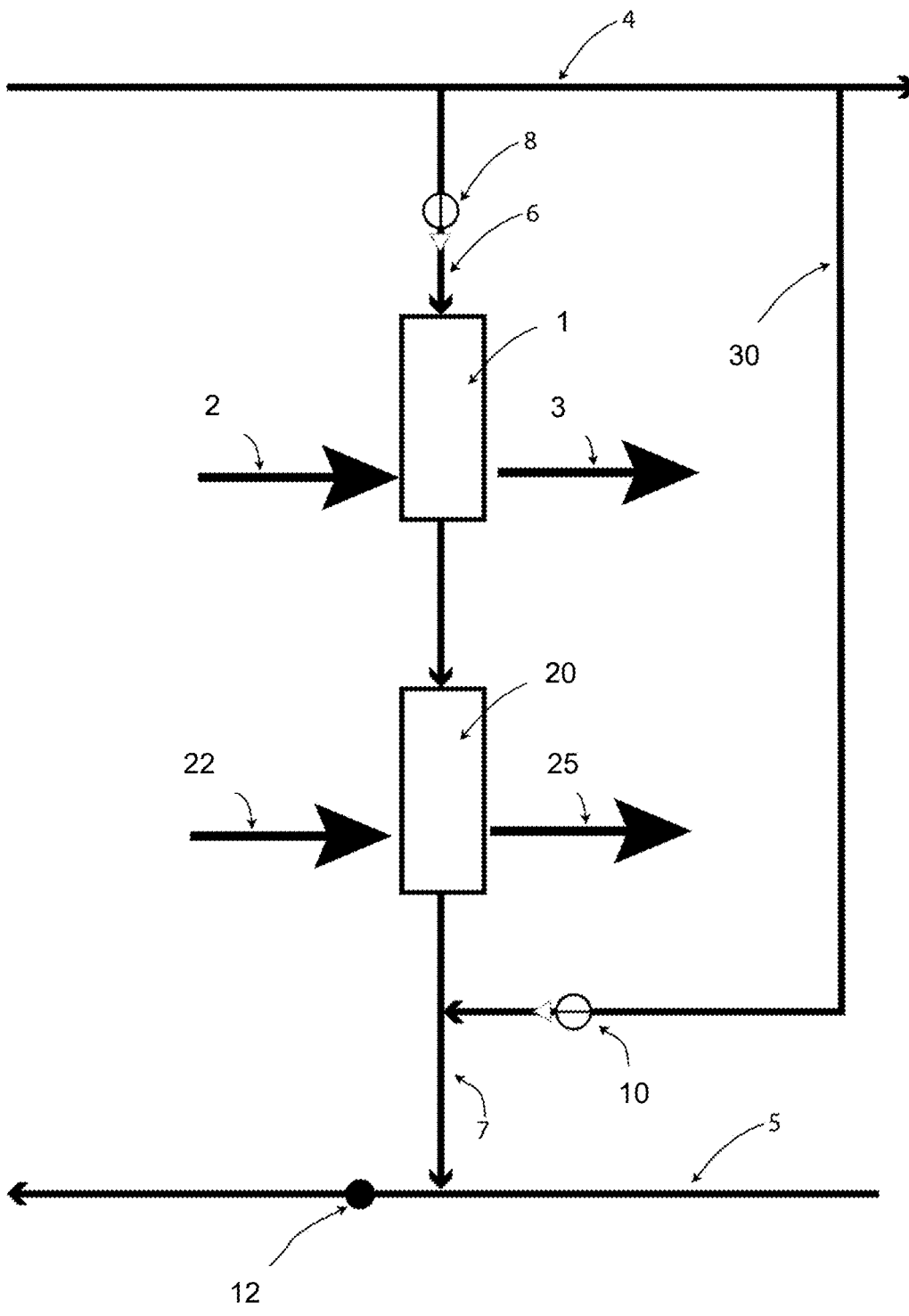
FIG. 7 is a schematic view of the basic configuration of the cooling system according to the third aspect of the present invention.
Figure 8:
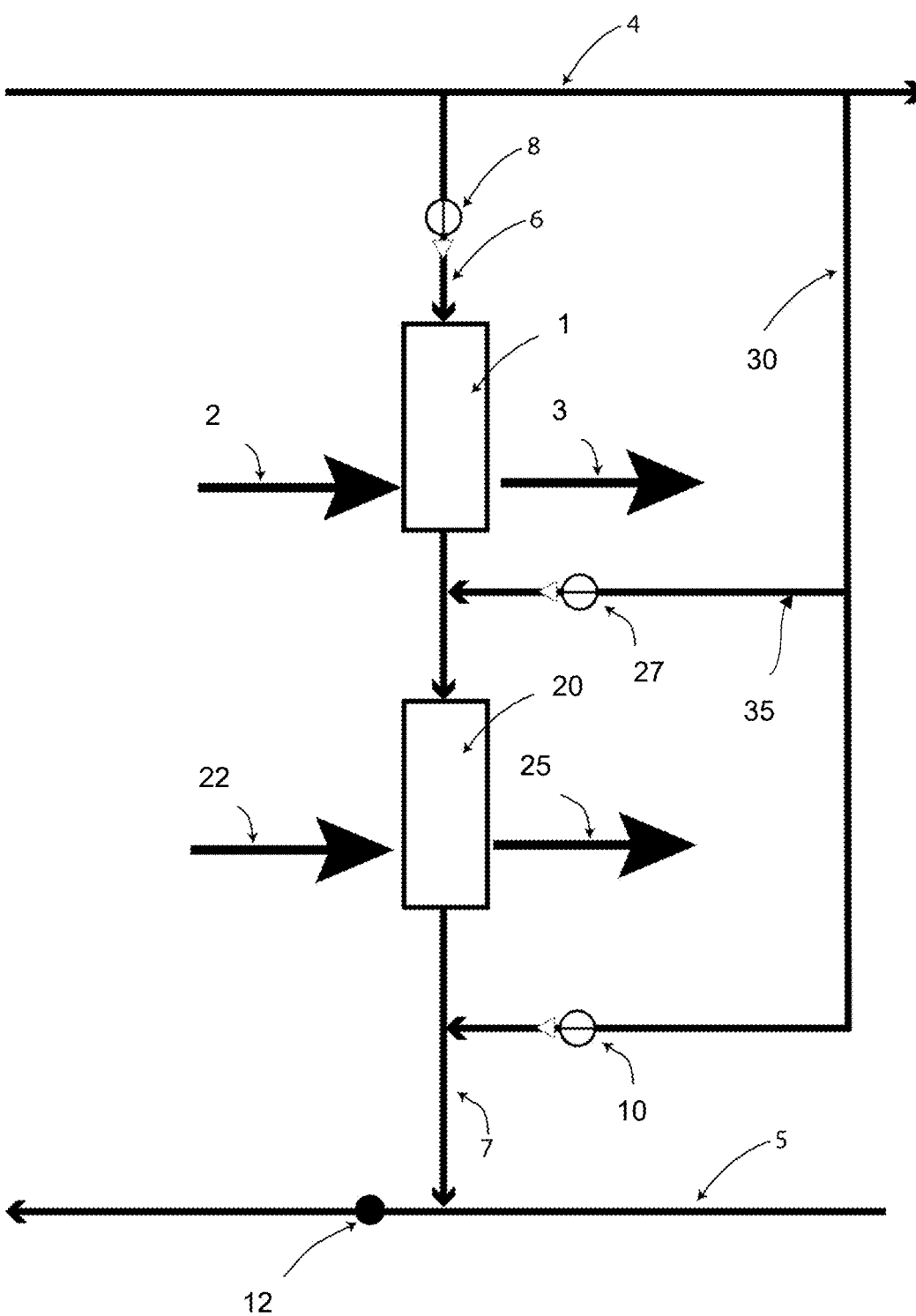
FIG. 8 is a schematic view of another alternative configuration of the cooling system of the invention.

A basic configuration of the cooling system of the third aspect of the present invention is illustrated schematically in FIG. 7. It may include a refrigerant supply line 4 providing a refrigerant at the first pressure from a refrigerant source. It may also include a refrigerant return line 5 configured to direct the refrigerant at a second pressure toward the refrigerant source for cooling and recirculating the refrigerant thereat. The second pressure may be lower than the first pressure to urge the refrigerant to flow through the cooling system.

A first heat exchanger 1 may be provided and configured to use the refrigerant circulating therethrough to cool air which passes through the first heat exchanger. As the incoming airflow 2 is cooled by the first heat exchanger 1, it is passed as airflow 3 to be used for active air cooling of the equipment in the facility. As seen in FIG. 7, the first heat exchanger 1 may have a first refrigerant inlet 6 configured to receive at least some refrigerant from the refrigerant supply line 4, as directed using the adjustable inlet valve 8. The first heat exchanger 1 may also have a first refrigerant outlet to direct the refrigerant downstream to other parts of the cooling system.

A second heat exchanger 20 may be provided and configured to use the refrigerant circulating therethrough to cool liquid which passes therethrough. In embodiments, the liquid flow 22 enters the second heat exchanger 20, gives out the heat, and is transformed into the liquid flow 25 on the outlet of the second heat exchanger 20. It is then used for active liquid cooling of the computer or other equipment in the facility. The second heat exchanger 20 may have a second refrigerant inlet fluidly connected with and configured to receive at least some refrigerant from the first refrigerant outlet of the first heat exchanger 1, as seen in FIG. 7. The second heat exchanger 20 may also have a second refrigerant outlet operably connected to direct at least some refrigerant from the second heat exchanger to the refrigerant return line 5.

The cooling system for the facility may further include an optional first bypass line 30 equipped with an in-line adjustable first valve 10 as described above. The valve 10 may be operable, when at least partially open, to allow at least some refrigerant to flow from the refrigerant supply line 4 toward and mix with the refrigerant of the refrigerant return line 5 or the refrigerant of the second refrigerant inlet, and without flowing through the first heat exchanger 1. The purpose of the first bypass line 30 is to ensure that the refrigerant temperature in the return line does not exceed a preset maximum value, which may be monitored using the return line temperature sensor 12.

In some embodiments, the refrigerant flow required for adequate performance of the first heat exchanger 1 matches the refrigerant flow required for adequate performance of the second heat exchanger 20. In this case, the cooling system may operate as seen in FIG. 7. When the refrigerant flow requirement of the second heat exchanger 20 exceeds that of the first heat exchanger 1, the cooling system may include a second bypass line 35 with a second adjustable valve 27. When at least partially open, the second bypass valve 27 may direct at least some additional refrigerant from the refrigerant supply line 4 to mix with and supplement the refrigerant coming out of the first heat exchanger 1 and toward the second refrigerant inlet of the second heat exchanger 20.

The cooling system, according to the third aspect of the present invention, may therefore include a refrigerant supply to the second heat exchanger 20 provided in at least one of the following modes:

entirely from the refrigerant supply line 4, or
   entirely after passing through the first heat exchanger 1, or
   as a mixture of at least some refrigerant flowing directly from the refrigerant supply line 4 and at least some refrigerant flowing after passing through the first heat exchanger 1.

Figure 9:
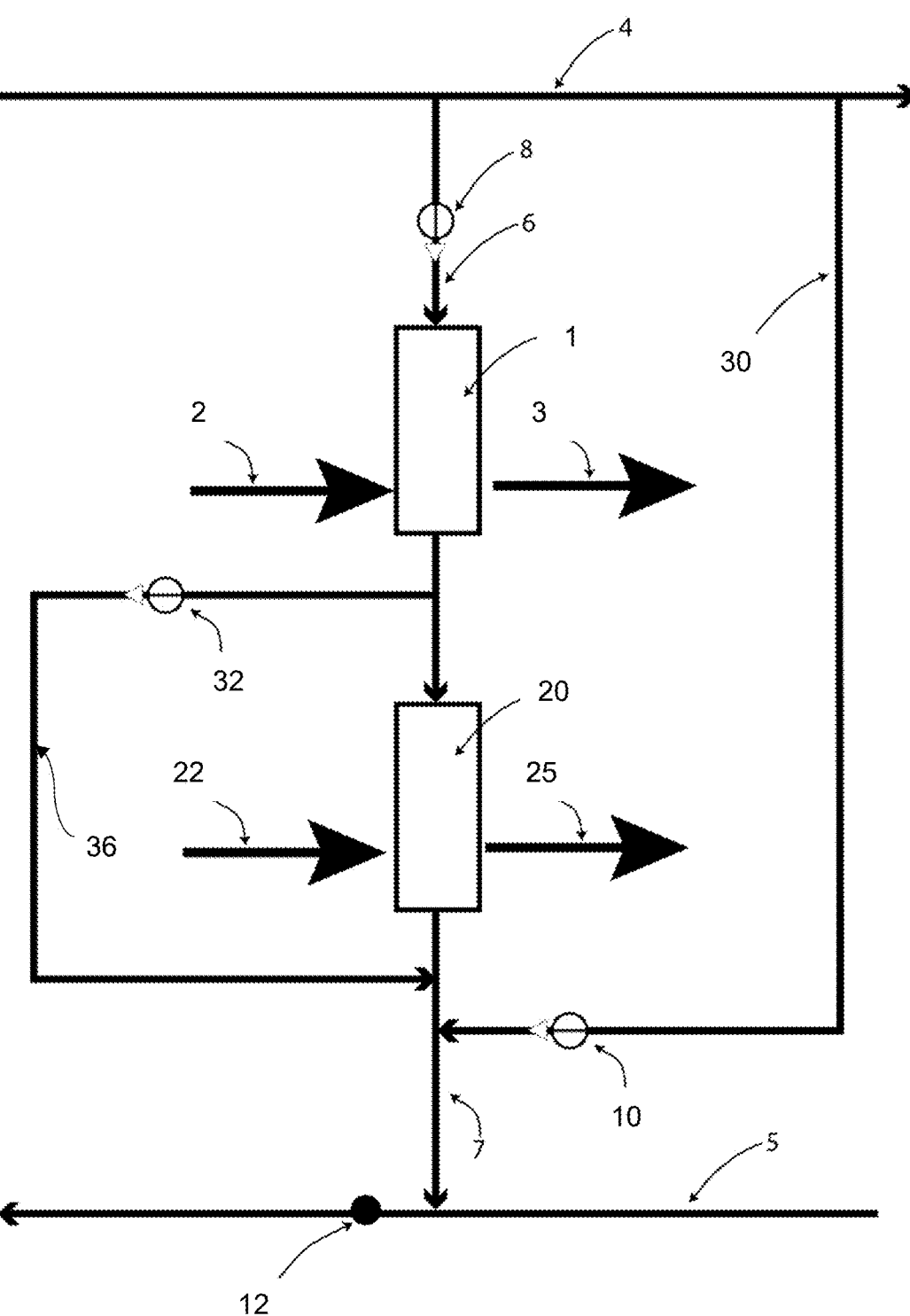
FIG. 9 is a schematic view of a further alternative configuration of the cooling system of the invention.

In further embodiments, when the refrigerant flow requirement of the second heat exchanger 20 is lower than that of the first heat exchanger 1, the cooling system may include another second bypass line 36 with the inline adjustable valve 32 designed, when at least partially open, to allow at least some refrigerant to flow from the first heat exchanger 1 toward and mix with the refrigerant flowing out of the second heat exchanger 20 without first flowing through the second heat exchanger 20. This configuration is illustrated in FIG. 9.

Figure 10:
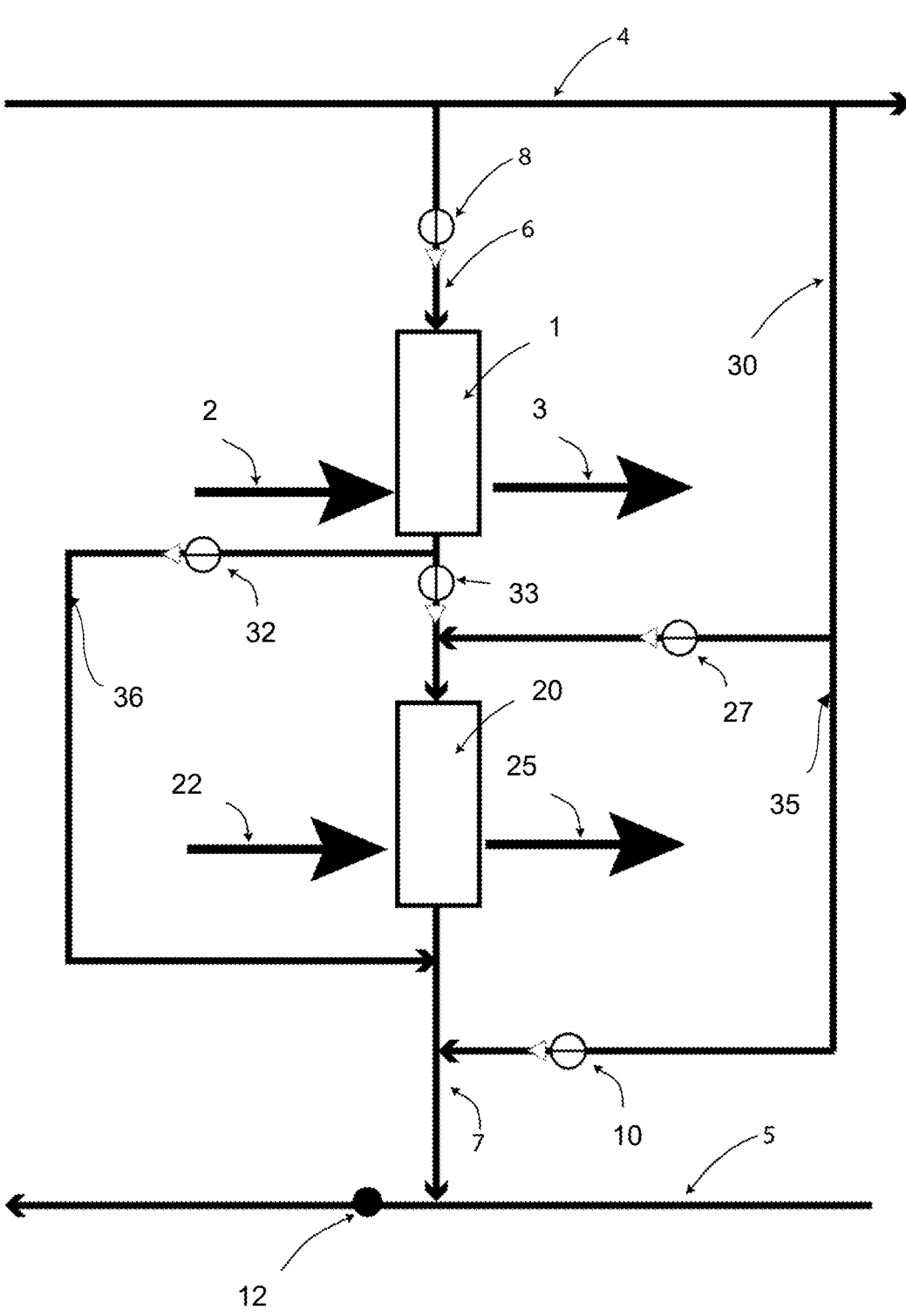
FIG. 10 is a schematic view of yet a further alternative configuration of the cooling system of the invention.

FIG. 10 shows a further configuration of the cooling system which combines elements of the configurations described above and illustrated in FIGS. 8 and 9.

Figure 11:
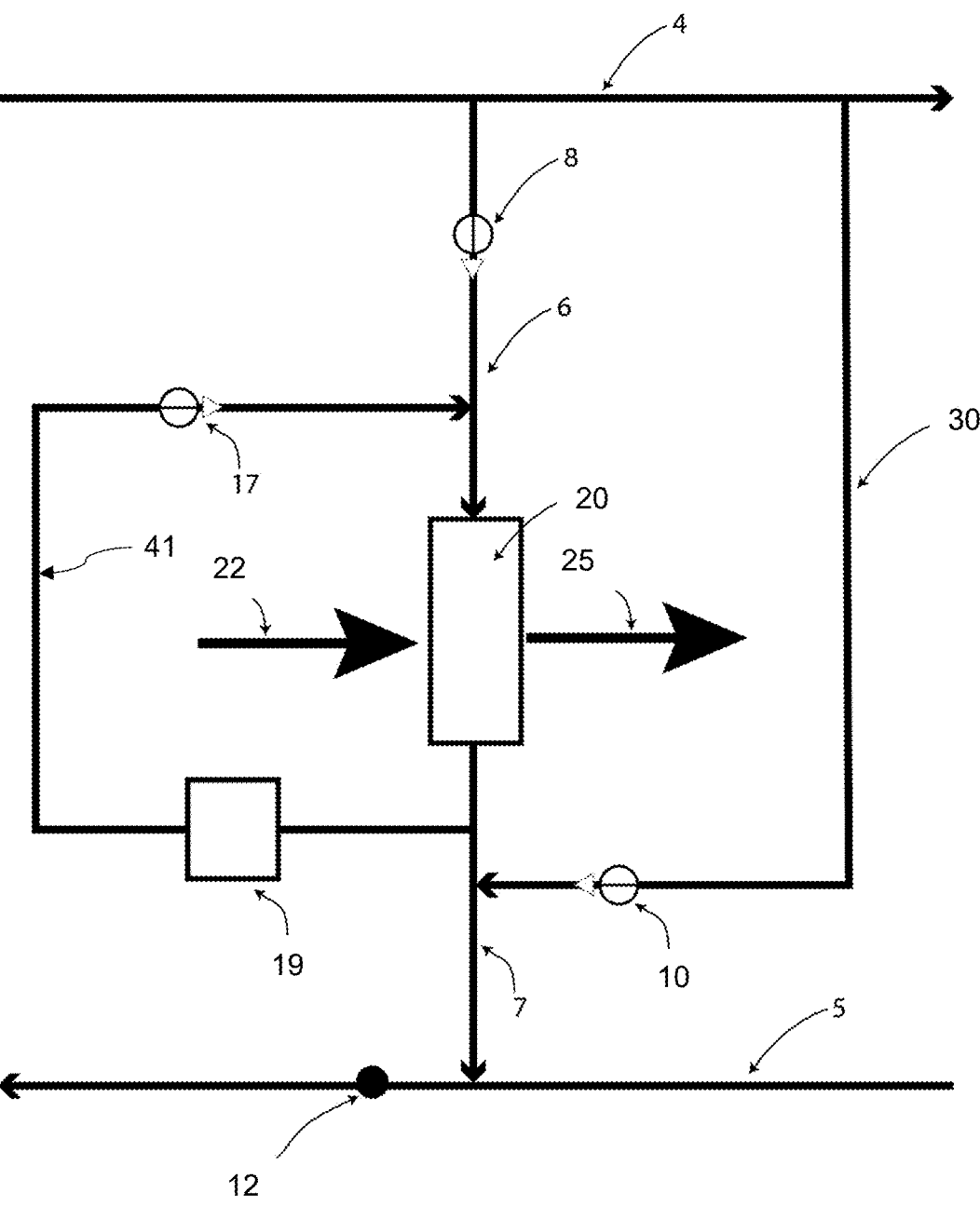
FIG. 11 is a schematic view of yet another alternative configuration of the cooling system of the invention.

FIG. 11 shows a further yet configuration of the cooling system in which the liquid-cooling second heat exchanger 20 is provided with a second recirculation line 41 configured to direct at least some refrigerant from the second refrigerant outlet of the second heat exchanger 20 through an in-line refrigerant pump 19 to mix with the refrigerant from the refrigerant supply line 4 and then flow back to the second refrigerant inlet of the second heat exchanger 20. The second recirculation line 41 may be used to increase the heat exchanging efficiency of the second heat exchanger 20 by recirculating at least some refrigerant flowing therethrough.

The novel cooling system may also include at least one temperature sensor (not shown) configured to measure refrigerant temperature at the second refrigerant inlet. In further embodiments, another temperature sensor may also be added at the second refrigerant outlet of the second heat exchanger 20.

In addition, an adjustable recirculation valve 17 may be added to the second recirculation line 41. This valve 17 may be used to adjust the refrigerant flow therethrough. Flow adjustment may also be made by adjusting the in-line refrigerant pump 19.

The novel cooling system may further include at least one pressure sensor (not shown) operatively positioned at the second refrigerant inlet or at the second refrigerant outlet and configured to respectively detect a refrigerant pressure at the second refrigerant inlet or at the second refrigerant outlet.

As in other embodiments described above, the cooling system may include at least one temperature sensor operatively positioned at the second inlet or operatively positioned at the second outlet of the second heat exchanger and configured to respectively detect a refrigerant temperature flowing at the second inlet or at the second outlet of the second heat exchanger.

In further embodiments, the novel cooling system of the invention may include a return line temperature sensor 12 positioned in the refrigerant return line 5 downstream of the first and second heat exchangers 1 and 20. The return line temperature sensor 12 may be configured to measure refrigerant temperature in the refrigerant return line 5 prior to reaching the refrigerant source.

Figure 12:
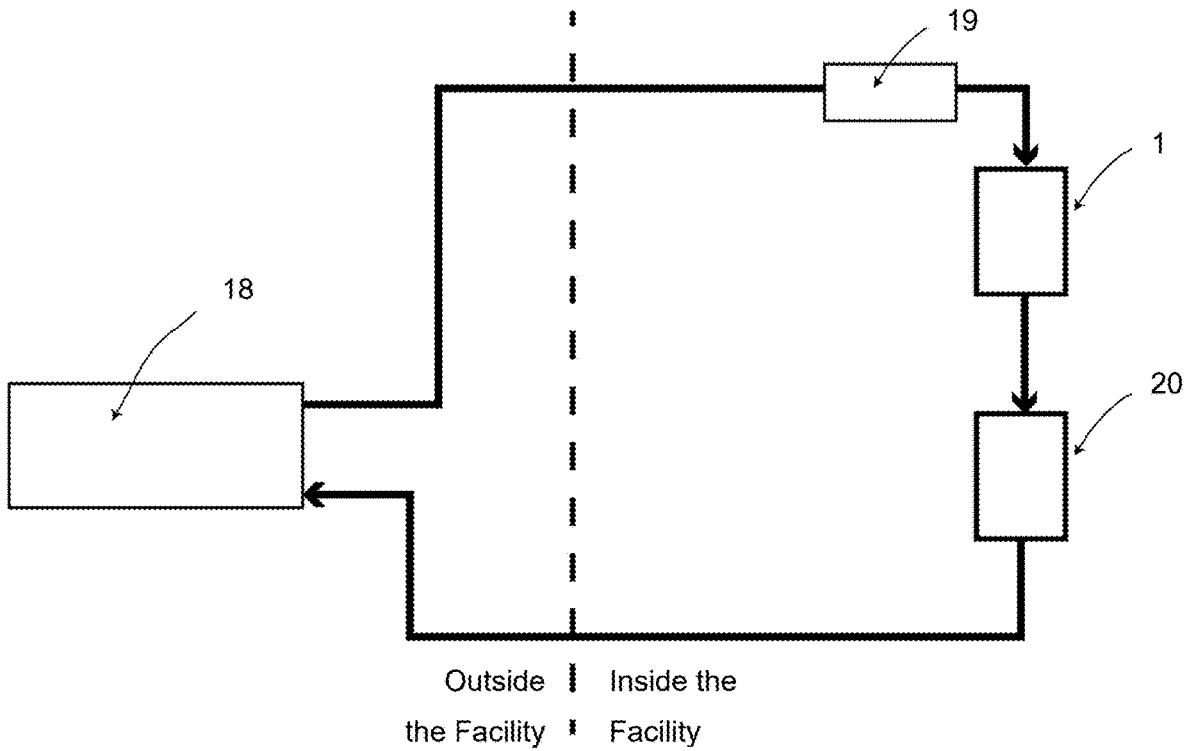
FIG. 12 is a schematic view of yet a further alternative configuration of the cooling system of the invention.

FIG. 12 shows a further alternative configuration of the cooling system in which the first air-cooling heat exchanger 1 is placed in series with the second liquid-cooling heat exchanger 20. The refrigerant may be flowing through the cooling system by the refrigerant pump 19. Importantly, the refrigerant may be at least partially or entirely cooled by a supplemental heat exchanger 18 which may be positioned outside and externally to the facility.

A novel method for cooling a facility employing equipment requiring active cooling, according to the third aspect of the invention, may include the following steps:

a. directing at least some refrigerant from a refrigerant source via a refrigerant supply line 4 pressurized at a first pressure through a first heat exchanger 1, wherein the first heat exchanger 1 may be configured to use the refrigerant circulating therethrough to cool air which passes through the first heat exchanger 1 and is used for active cooling of the air-cooled equipment in the facility, b. directing at least some refrigerant from the first heat exchanger 1 to flow through a second heat exchanger 20, wherein the second heat exchanger 20 may be configured to use the refrigerant circulating therethrough to cool liquid which passes through the second heat exchanger 20 and is used for active cooling of the liquid-cooled equipment in the facility, wherein refrigerant supply to the second heat exchanger 20 may be provided in one of the following modes:

entirely from the refrigerant supply line 4, or entirely after passing through the first heat exchanger 1, or as a mixture of at least some refrigerant flowing directly from the refrigerant supply line 4 and at least some refrigerant flowing after passing through the first heat exchanger 1, and c. directing the refrigerant to flow from the second heat exchanger 20 toward the refrigerant source via a refrigerant return line 5 at a second pressure, wherein the second pressure is lower than the first pressure.

The method for cooling the facility may further include a step of directing at least some refrigerant from the first refrigerant outlet of the first heat exchanger 1 or from the refrigerant supply line 4 to the refrigerant return line without passing through the second heat exchanger 20.

The method for cooling the facility may also include a step of directing at least some refrigerant from the refrigerant supply line 4 directly to the second heat exchanger 20 without passing first through the first heat exchanger 1.

Figure 15:
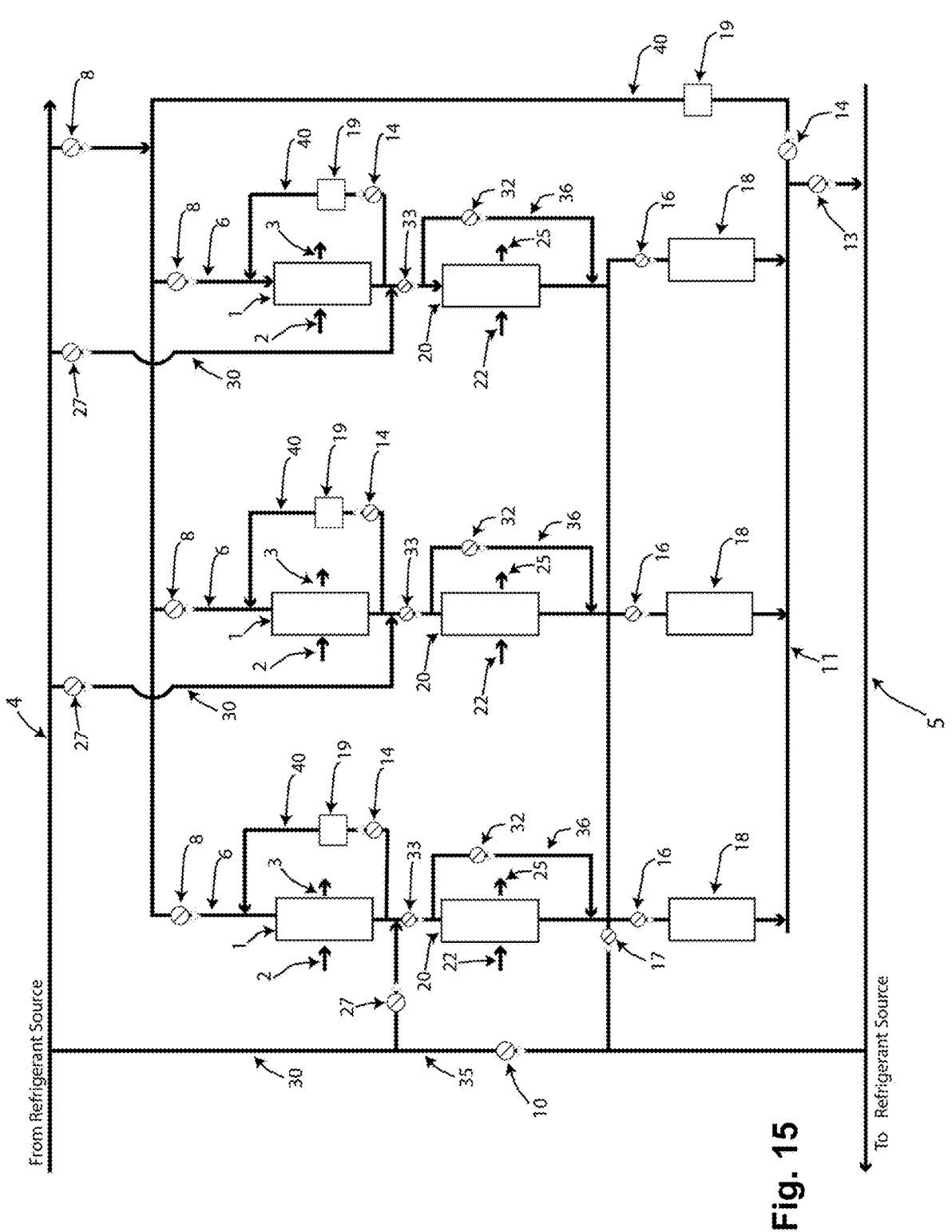
FIG. 15 shows a schematic view of the cooling system combining various aspects of the invention.

As can be appreciated by those skilled in the art, a cooling system for the facility described herein may be configured to use one or more fluid circuits described above in any combination that is the most suitable for a specific facility according to the expected cooling demand and according to various local conditions. FIG. 15 illustrates one example of a comprehensive cooling system that combines a number of first and second heat exchangers 1 and 20, their respective bypass lines, adjustable flow valves, temperature and pressure sensors, and other elements described above in greater detail. Multiple other configurations are also possible and are generally included in the scope of the present invention.

It is therefore generally contemplated that any embodiment discussed in this specification can be implemented with respect to any method of the invention, and vice versa. It will be also understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference. Incorporation by reference is limited such that no subject matter is incorporated that is contrary to the explicit disclosure herein, no claims included in the documents are incorporated by reference herein, and any definitions provided in the documents are not incorporated by reference herein unless expressly included herein.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. In embodiments of any of the compositions and methods provided herein, "comprising" may be replaced with "consisting essentially of" or "consisting of". As used herein, the phrase "consisting essentially of" requires the specified integer(s) or steps as well as those that do not materially affect the character or function of the claimed invention. As used herein, the term "consisting" is used to indicate the presence of the recited integer (e.g., a feature, an element, a characteristic, a property, a method/process step or a limitation) or group of integers (e.g., feature(s), element(s), characteristic(s), propertie(s), method/process steps or limitation(s)) only.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCC, CBBAAA, CABABB, and so forth. The skilled artisan will understand that typically there is no limit on the number of items or terms in any combination, unless otherwise apparent from the context.

As used herein, words of approximation such as, without limitation, "about", "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skilled in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12, 15, 20 or 25%.

All of the devices and/or methods disclosed and claimed herein can be made and executed without undue experimentation in light of the present disclosure. While the devices and methods of this invention have been described in terms of preferred embodiments, it will be apparent to those of skill in the art that variations may be applied to the devices and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

What is claimed is:

1. A cooling system for a facility employing equipment requiring active cooling, the cooling system comprising:
   a refrigerant supply line providing a refrigerant at a first pressure from a refrigerant source,
   a refrigerant return line directing the refrigerant at a second pressure toward the refrigerant source for cooling and recirculating of the refrigerant at the refrigerant source, wherein the second pressure is lower than the first pressure,
   a first heat exchanger configured to use the refrigerant circulating through the first heat exchanger to cool air or liquid which passes through the first heat exchanger and is used for active cooling of the equipment in the facility, the first heat exchanger having a first refrigerant inlet configured to receive at least some refrigerant from the refrigerant supply line, the first heat exchanger having a first refrigerant outlet operably connected to direct at least some refrigerant to the refrigerant return line, and
   a first recirculation line configured to direct at least some refrigerant from the first refrigerant outlet of the first heat exchanger through an in-line refrigerant pump to mix with the refrigerant from the refrigerant supply line and then flow to the first refrigerant inlet of the first heat exchanger,
   wherein the in-line refrigerant pump is configured to increase refrigerant pressure from the second pressure to the first pressure, and wherein the in-line refrigerant pump is configured to provide flow only to refrigerant in the first recirculation line and not to any other refrigerant in the cooling system,
   wherein the in-line refrigerant pump is configured not to provide refrigerant flow to the refrigerant source,
   thereby increasing the heat exchanging efficiency of the first heat exchanger by recirculating at least some refrigerant flowing through the first heat exchanger.

2. The cooling system of claim 1, further comprising at least one temperature sensor configured to measure refrigerant temperature at the first refrigerant inlet of the first heat exchanger and/or at the first refrigerant outlet of the first heat exchanger.

3. The cooling system of claim 1, further comprising at least one additional heat exchanger, wherein the first recirculation line is configured to direct at least some refrigerant from the first refrigerant outlet of the first heat exchanger or from a refrigerant outlet of the at least one additional heat exchanger through the in-line refrigerant pump to flow to the first refrigerant inlet of the first heat exchanger.

4. The cooling system of claim 1, further comprising a return line temperature sensor positioned in the refrigerant return line downstream of the first heat exchanger, wherein the return line temperature sensor is configured to measure refrigerant temperature in the refrigerant return line prior to reaching the refrigerant source.

5. The cooling system of claim 1, wherein the refrigerant and/or the liquid passing through the first heat exchanger is selected from a group consisting of a one-phase refrigerant, a two-phase refrigerant, water, and a mix of water and glycol.

6. The cooling system of claim 1, wherein the facility is a computer data center and the air or liquid passing through the first heat exchanger is used for active cooling of computer equipment of the data center.

7. The cooling system of claim 1, wherein the cooling system further comprises a refrigerant circulation loop comprising the first heat exchanger and a supplemental heat exchanger positioned downstream of the first heat exchanger, the supplemental heat exchanger is placed outside the facility.

8. The cooling system of claim 7, further comprising a circulation bypass line with an in-line circulation bypass valve, the circulation bypass line configured to direct the refrigerant directly downstream and not through the supplemental heat exchanger when an ambient temperature is at or above a refrigerant temperature at the first refrigerant outlet of the first heat exchanger.

9. A method for cooling a facility employing equipment requiring active cooling, the method comprising the following steps:
   a. directing a refrigerant from a refrigerant supply line pressurized at a first pressure through a first heat exchanger, wherein the first heat exchanger is configured to use the refrigerant circulating through the first heat exchanger to cool air or liquid which passes through the first heat exchanger and is used for active cooling of the equipment in the facility,
   b. directing the refrigerant to flow from the first heat exchanger to a refrigerant return line at a second pressure, wherein the second pressure is lower than the first pressure, and
   c. using an in-line refrigerant pump that provides flow only to refrigerant in a first recirculation line and not to the refrigerant source or any other refrigerant in the cooling system, and that is configured not to provide refrigerant flow to the refrigerant source, directing at least some refrigerant after passing through the first heat exchanger to mix with the refrigerant from the refrigerant supply line and then flow again through the first heat exchanger, wherein the in-line refrigerant pump increases refrigerant pressure from the second pressure to the first pressure, thereby recirculating at least some refrigerant to flow through the first heat exchanger to increase heat extraction therefrom.

10. The method of claim 9, wherein the facility is a computer data center and the air or liquid passing through the first heat exchanger is used for active cooling of computer equipment of the data center.

11. The method of claim 9, further comprising a step of providing a supplemental heat exchanger positioned outside the facility, and directing refrigerant from the first heat exchanger to the supplemental heat exchanger only when an ambient temperature is below a refrigerant temperature at the first refrigerant outlet of the first heat exchanger to at least partially extract heat from the refrigerant prior to directing the refrigerant to the refrigerant return line.

12. The method of claim 11, further comprising a step of bypassing the supplemental heat exchanger and directing the refrigerant directly to the refrigerant return line when the ambient temperature is at or above the refrigerant temperature at the first refrigerant outlet of the first heat exchanger.

13. The method of claim 9, further comprising a step of directing at least some refrigerant after passing through the first heat exchanger to flow through at least one additional heat exchanger prior to directing the refrigerant to the refrigerant return line.

\* \* \* \* \*